(12) United States Patent
Self

(10) Patent No.: US 11,274,946 B2
(45) Date of Patent: *Mar. 15, 2022

(54) TIC ENVIRONMENTAL EVENT SENSOR

(71) Applicant: Darrel Eugene Self, Kannapolis, NC (US)

(72) Inventor: Darrel Eugene Self, Kannapolis, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 17/222,128

(22) Filed: Apr. 5, 2021

(65) Prior Publication Data
US 2021/0223069 A1 Jul. 22, 2021

Related U.S. Application Data

(63) Continuation of application No. 16/389,971, filed on Apr. 21, 2019, now Pat. No. 10,969,255.

(60) Provisional application No. 62/660,926, filed on Apr. 20, 2018.

(51) Int. Cl.
| | | |
|---|---|---|
| *G01D 9/00* | (2006.01) | |
| *H05K 5/00* | (2006.01) | |
| *H01Q 5/20* | (2015.01) | |
| *G01D 7/00* | (2006.01) | |
| *H04B 1/40* | (2015.01) | |

(52) U.S. Cl.
CPC ............... *G01D 9/005* (2013.01); *G01D 7/00* (2013.01); *H01Q 5/20* (2015.01); *H04B 1/40* (2013.01); *H05K 5/0017* (2013.01); *H05K 5/0091* (2013.01)

(58) Field of Classification Search
CPC . G01D 9/005; G01D 7/00; H01Q 5/20; H04B 1/40; H05K 5/0017; H05K 5/0091
See application file for complete search history.

(56) References Cited

U.S. PATENT DOCUMENTS

| | | | | |
|---|---|---|---|---|
| 2006/0046711 | A1* | 3/2006 | Jung | H04W 4/38 455/423 |
| 2009/0319551 | A1* | 12/2009 | Jung | H04L 67/125 |
| 2012/0011511 | A1* | 1/2012 | Horvitz | G06F 9/461 718/100 |
| 2012/0069517 | A1* | 3/2012 | Prest | G02F 1/13439 361/679.56 |
| 2015/0103663 | A1* | 4/2015 | Amini | H04B 1/0053 370/235 |
| 2015/0254495 | A1* | 9/2015 | Rowe | G06K 9/00033 382/124 |
| 2015/0375428 | A1* | 12/2015 | Reeves | C08G 18/7671 264/40.1 |

(Continued)

*Primary Examiner* — Amine Benlagsir

(57) ABSTRACT

The TIC environmental event sensor is a nickel-sized, ultra-thin circuit assembly, containing an extremely compact array of both environmental sensors and physical sensors, along with local and wireless access to all the sensor data, including BTLE & LoRa, as well as an electronic ink display for limited field access to sensor events in real time. The TIC is designed to capture changes in the sensor data in real time, and then log it for future examination. The most recent change will remain on the device's display. The changes can then be transmitted to a smart phone or tablet via BTLE, networked as an asset via LoRa, or locally scrolled at the device. The TIC is Ideal for tracking any variations in the surrounding conditions of an asset's travel, storage or use.

10 Claims, 36 Drawing Sheets

(56) References Cited

U.S. PATENT DOCUMENTS

| | | | |
|---|---|---|---|
| 2016/0123828 A1* | 5/2016 | Matzen | G01L 9/0055 |
| | | | 73/723 |
| 2016/0349116 A1* | 12/2016 | Schechter | H04Q 9/00 |
| 2017/0177213 A1* | 6/2017 | Yim | G06F 3/04883 |
| 2017/0277386 A1* | 9/2017 | Cho | G06F 3/04817 |
| 2018/0092565 A1* | 4/2018 | Lee | A61B 5/369 |
| 2018/0172615 A1* | 6/2018 | Lau | G01N 27/286 |

\* cited by examiner

TIC ENVIRONMENTAL EVENT SENSOR

CROSS REFERENCE TO RELATED APPLICATIONS

This application claims the benefit of prior application U.S. Ser. No. 16/389,971 filed Apr. 21, 2019 to Darrel Eugune Self entitled TIC ENVIRONMENTAL EVENT SENSOR, and the entire disclosure of this Utility patent application is hereby incorporated by reference thereto, in its entirety; and which claims the priority (timely filed under the Next Business Day Rule) of Provisional Application No. 62/660,926 filed on Apr. 20, 2018, inventor Darrel Eugene Self, entitled "TIC ENVIRONMENTAL EVENT SENSOR". The entire disclosure of this provisional patent application is hereby incorporated by reference thereto, in its entirety.

STATEMENT REGARDING FEDERALLY SPONSORED RESEARCH OR DEVELOPMENT

Not applicable.

FIELD OF THE INVENTION

The present invention relates to an environmental event sensors, for sensing an array of both environmental and physical events, and for providing local and wireless access to the sensor data.

BACKGROUND OF THE INVENTION

It is a problem in the art to provide a sensor for recording events that occur over a period of time. Such sensors have use in areas in many fields. For example, it is needed where it may be important to know the number of duty cycles that have occurred, such as for warranty purposes in a mechanical or electrical device, so that a manufacturer can set a limit for warranty purposes. Other events can be sensed, which likewise can apply for warranty purposes, such as high or low temperature, high or low pressure, exposure to certain gasses, and so on.

Such sensors are also useful for preventive maintenance purposes, so that during maintenance it can determined whether a particular device, object, or circuit needs to be replaced.

Further uses include the transportation and storage industries. And, manufacturing and processing industries have equipment, sensors, machinery and circuits which can be monitored with an event sensor.

The size and life of an event sensor matter, and in many cases the smaller the sensor the better, and the longer-lived the sensor, the better.

There is a need for a long-lived sensor which is high in efficiency, which is small in size with miniaturized components, and which can record events that are sensed. There is also a need for a long-lived sensor in which event parameters can be set, so that it will record events above and/or below such parameters. There is also a need for a sensor that can display the events, and wherein the events are selectable during display.

SUMMARY OF THE INVENTION

From the foregoing, it is seen that it is a problem in the art to provide a device meeting the above requirements. According to the present invention, a device is provided which meets the aforementioned requirements and needs in the prior art. Specifically, the device according to the present invention provides a sensor having a display and sensor circuitry having a power source, miniaturized components, and a plurality of sensors.

The sensor device of the present invention provides a long-lived sensor which is high in efficiency, which is small in size with miniaturized components, and which can record events that are sensed. The present invention also provides a sensor in which event parameters can be set, so that it will record events above and/or below such parameters.

The invention further provides a sensor that can display the events, and wherein the events are selectable during display.

The TIC environmental event sensor is a nickel-sized, ultra-thin circuit assembly, containing an extremely compact array of both environmental sensors and physical sensors, along with local and wireless access to all the sensor data, including BTLE & LoRa, as well as an electronic ink display for limited field access to sensor events in real time. The TIC is designed to capture changes in the sensor data in real time, and then log it for future examination. The most recent change will remain on the device's display. The changes can then be transmitted to a smart phone or tablet via BTLE, networked as an asset via LoRa, or locally scrolled at the device. The TIC is Ideal for tracking any variations in the surrounding conditions of an asset's travel, storage or use.

Other objects and advantages of the present invention will be more readily apparent from the following detailed description when read in conjunction with the accompanying drawings.

DETAILED DESCRIPTION OF THE INVENTION

The TIC environmental event sensor of the present invention, described in detail further below, is a nickel-sized, ultra-thin circuit assembly, containing an extremely compact array of both environmental sensors and physical sensors, along with local and wireless access to all the sensor data, including BTLE & LoRa, as well as an electronic ink display for limited field access to sensor events in real time. The letters TIC are merely a shorthand designation for the device and the letters are not abbreviations and have no meaning in and of themselves.

The TIC is designed to capture changes in the sensor data in real time, and then log it for future examination. The most recent change will remain on the device's display. The changes can then be transmitted to a smart phone or tablet via BTLE, networked as an asset via LoRa, or locally scrolled at the device. The TIC is Ideal for tracking any variations in the surrounding conditions of an asset's travel, storage or use.

Figure 1A:
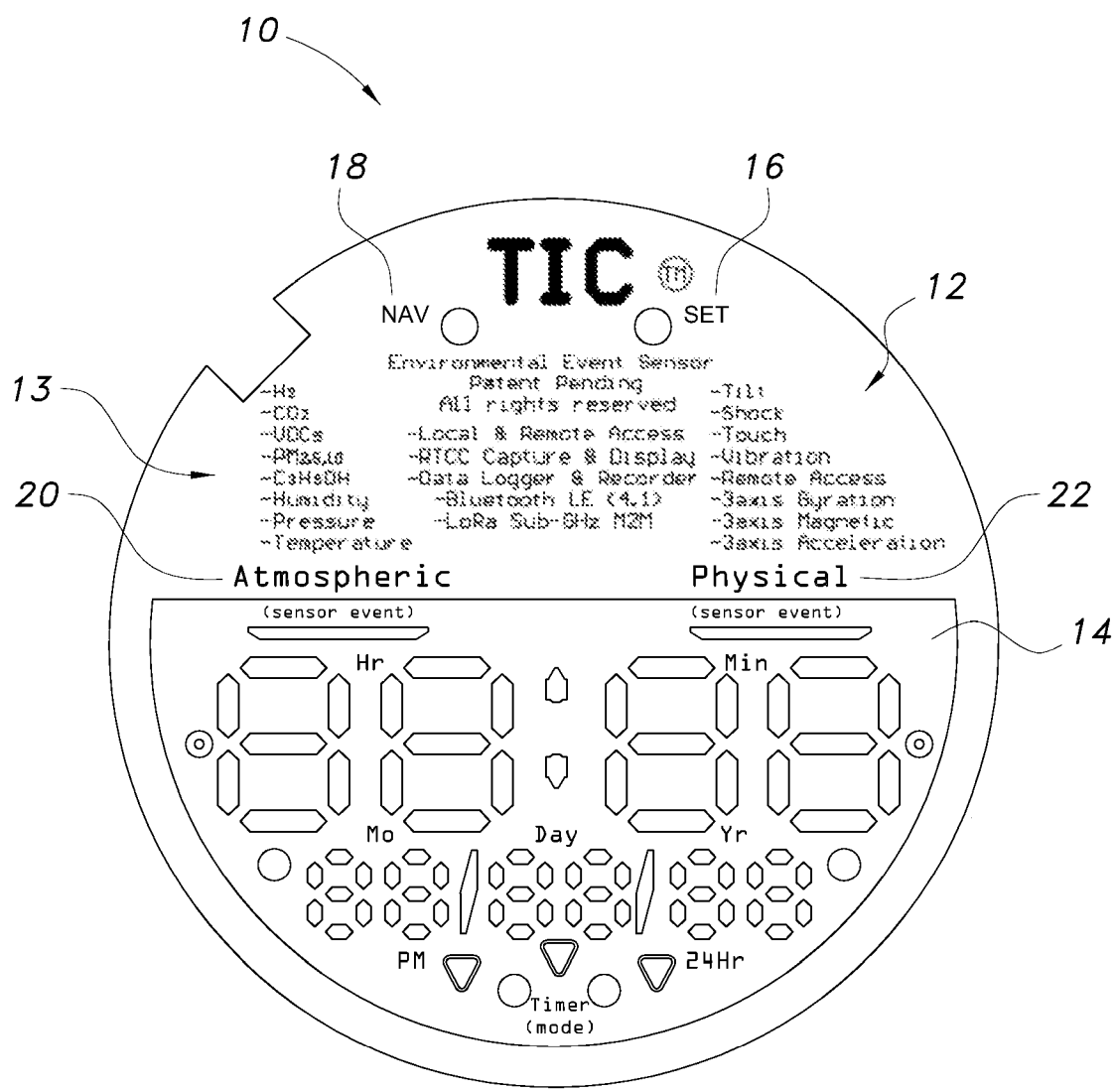
FIG. 1A is a TIC environmental event sensor.

FIG. 1A is a TIC environmental event sensor 10 (hereafter also referred to a TIC 10). FIG. 1A represents the face of the device 10 as the user would see it.

An indicia section 12 shows physical sensor features available on the TIC 10. These physical sensor features include: tilt, shock, touch, vibration, remote access, 3-axis gyration, 3-axis magnetic field detection, and 3-axis acceleration detection.

An electronic ink display 14 is shown, and is the local interface for the TIC 10 to the sensor event data. This display 14 is used to read the basic time and measurement of each sensor event. It has icons at the bottom that display the TIC 10 timing and clock modes. Icon bars at the top display (using an underscore indicator) the type of event recorded, i.e. whether physical events or environmental events.

A SET key 16 is provided for local access to the TIC's internal clock and sensor settings, and is operated much like a traditional programming pin button on a digital watch.

A NAV key 18 is provided that serves as a local navigation scroll through the TIC is internal clock and sensor settings. The NAV key 18 is much like the traditional scrolling pin button on a digital watch.

A display icon 20 indicates the word atmospheric, and indicates an icon within the display that appears if the recorded event is environmental. A display icon 22 represents an icon with in the display that appears if the recorded event is physical. This is a display for a physical sensor event.

Figure 1B:
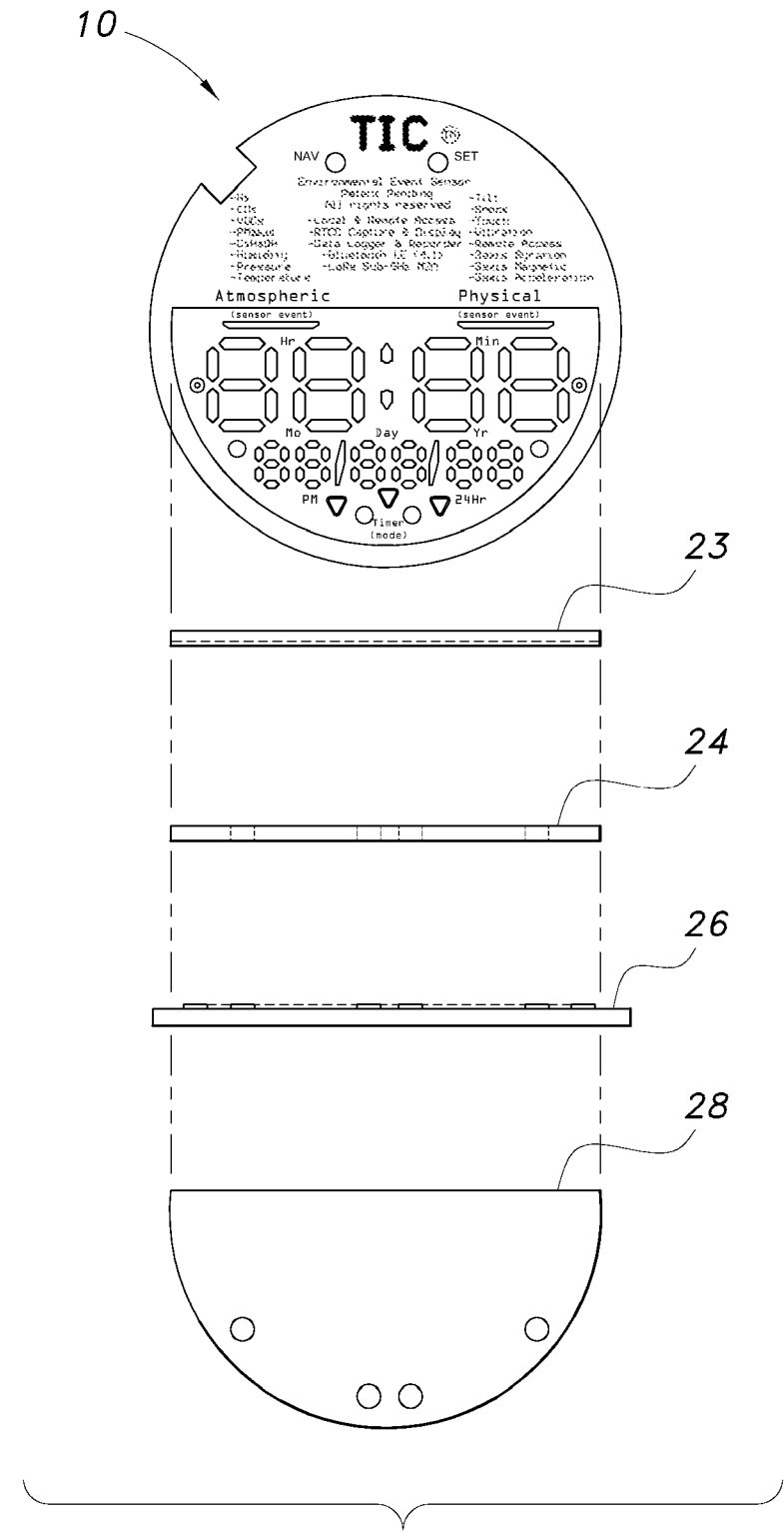
FIG. 1B shows construction of the device, wherein in the display at the top is that shown in FIG. 1A.

FIG. 1B shows construction of the device 10, wherein in the display at the top is that shown in FIG. 1A. The assembly of FIG. 1B includes a layer 23, which is a PET and ITO layer of the TIC display. The layer 23 represents the transparent face layer of the electronic ink construction.

Beneath the layer 23 is a layer 24, wherein the layer 24 is a matrix and electronic ink layer on the TIC's display 14. The layer 24 represents the transparent face layer of the electronic ink construction.

A layer 26 is shown below the layer 24, the layer 26 showing and end view or profile of the TIC's printed circuit board. This represents the electrical and foundation layer of the electronic ink construction. This is the core of the TIC's electronic ink display 14.

A layer 28 is disposed below the layer 26. The layer 28 is a stencil and bonding reference. This represents the adhesive stencil and tooling fabrication for the TIC's PCB display area.

PET Layer (Non-Conductive Adhesive or Seal):

The matrix layer is a porous nanocomposite, Patented by Zikon, including TiO2 nanoparticles, this nanocomposite is spray-painted onto the ITO-side of the PET film, and cross-linked by a polymer blend, composed of silicone and acrylates. After drying, the composite adheres (lightly) to the PET, (not glued). The TIC PCB embeds exposed Gold Plated Segments in a top layer of Copper, using a power heat press, the PET-Matrix shown above is then pressed with force onto the TIC PCB's Gold surface, fitted with adhesive and Silver epoxy for 5 nm at 250 F. The matrix itself is not physically bonded or glued to the gold plated segments, but tightly compressed against the gold. Time and Temperature are then needed to raise the temperature of the PET above the glass temperature and to cure the epoxy film that binds your board to the PET edge that was pre-abrased and patterned with NPT holes. UV-triggered thermosetting films will not migrate into the Matrix under Temp or Pressure, and if using a Gasket, cut out with a vinyl cutter, not a CO2 laser as it melts and destroys the adhesive, and then place the cut-out onto the PCB and heat tacked according to datasheet Instructions. After UV activation, Silver Epoxy is placed on the PCB Connection Pads where shown.

Figure 2A:
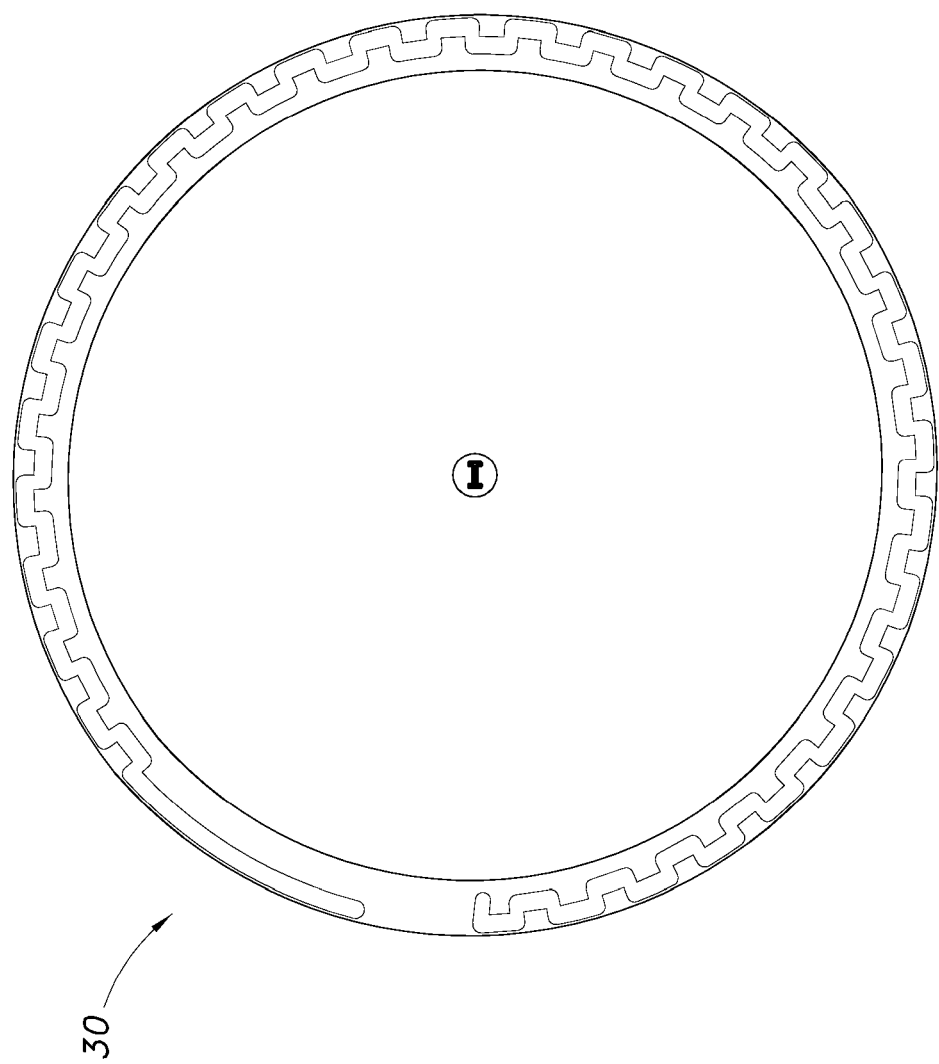
FIG. 2A shows a front view of a sub-GHz antenna and touch ring.

FIG. 2A shows a front view of a sub-GHz antenna and touch ring 30. The antenna is a 2.4 GHZ/sub-GHZ antenna. This represents the TIC's embedded trace designed for the LoRa radio frequencies.

Figure 2B:
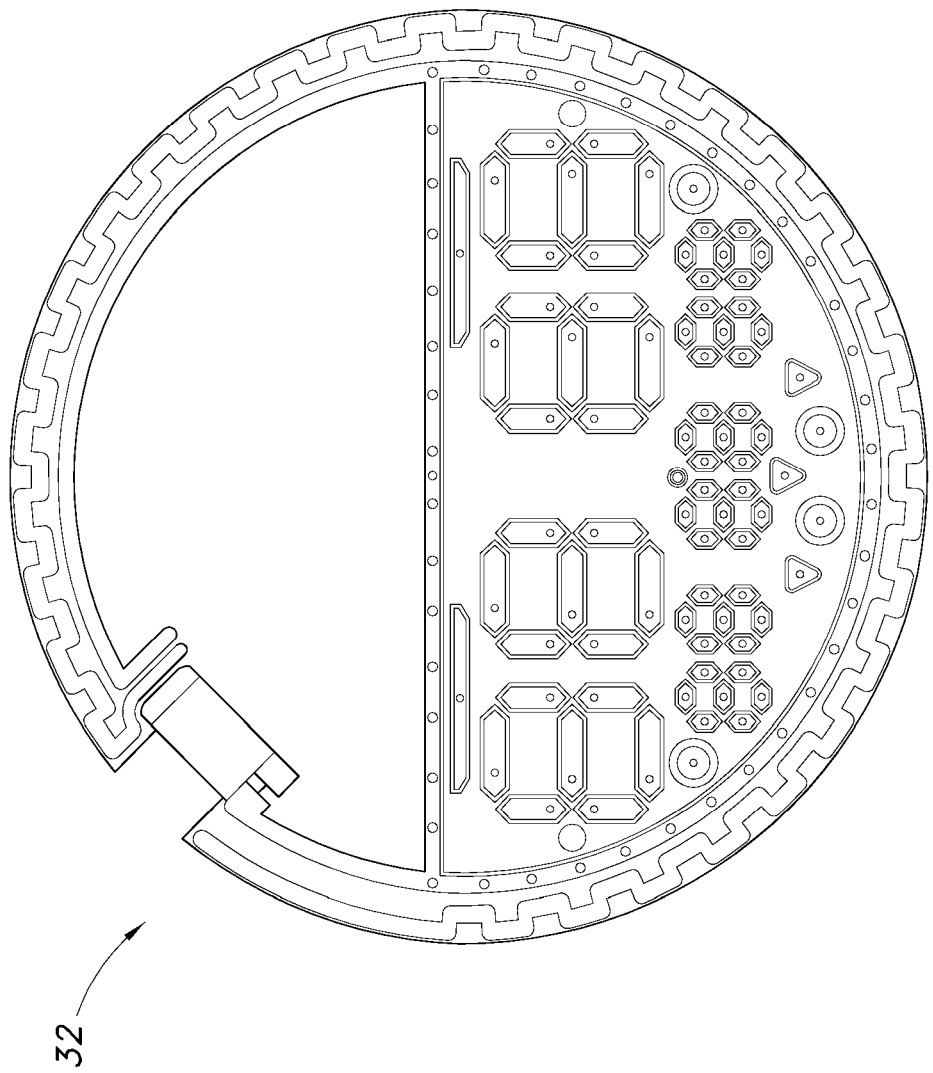
FIG. 2B shows a tri-frequency antenna and touch ring.

FIG. 2B shows a tri-frequency antenna and touch ring 32. The antenna 32 represents the TIC's embedded multifrequency transmission and receiving artwork, and this custom RF pattern allows the TIC 10 to connect (by radio transmission) to other devices and also allows the TIC 10 to sense a human touch. This view also shows the top copper display area isolated inside of the antennas GND ring (unnumbered in this view).

The device shown in FIG. 2 is also referred to herein as "Custom Human Interfaces" (RF and Touch Sensing). Along with detecting complex movements, the TIC also embeds a Custom Touch mechanism as shown, designed to flag any handling of the device. At the heart of this sensor, is Microchip Technologies' mTouch Sensing Solution, which is a touch sensing method based on changes in capacitance. The mTouch™ Sensing Solution system operates by creating a parasitic capacitance between a touch sensor pad on the system PCB and ground. When the user's finger comes into close proximity to the sensor pad, an increase in capacitance is generated by the iron in the user's blood. This forms an additional sensor pad and is coupled to ground through the user's extremities. Many modern applications implement capacitive sensing to provide a sleek, aesthetic, and professional look to their product. In the TIC's case, this water resistant technology provides a robust indoor and outdoor sensor, that can be embedded into the PCB tracing itself, allowing it's mechanism to seem to disappear into the TIC's architecture.

Figure 3A:
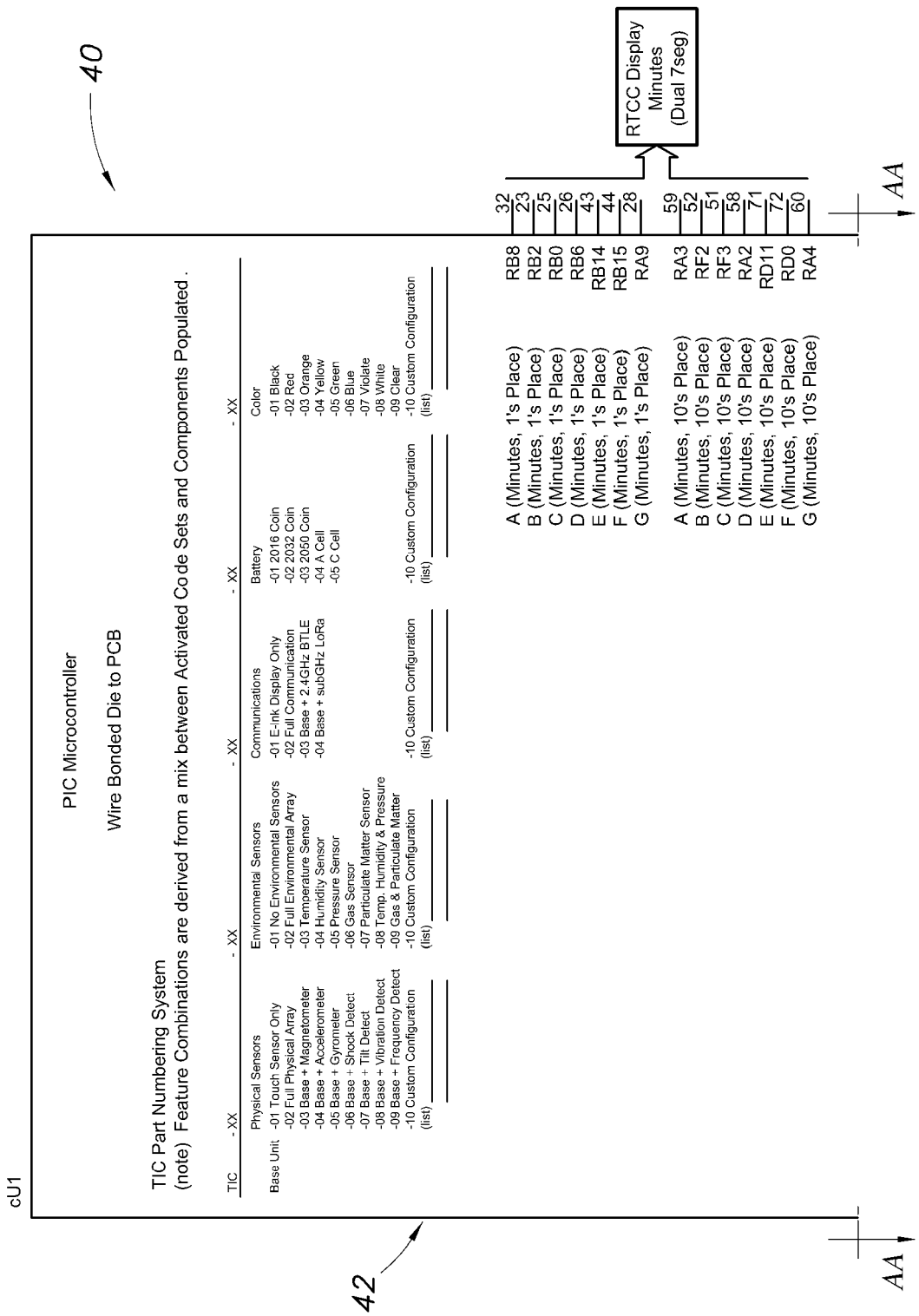
FIG. 3A, FIG. 3B, and FIG. 3C together show a microcontroller block diagram.
Figure 3B:
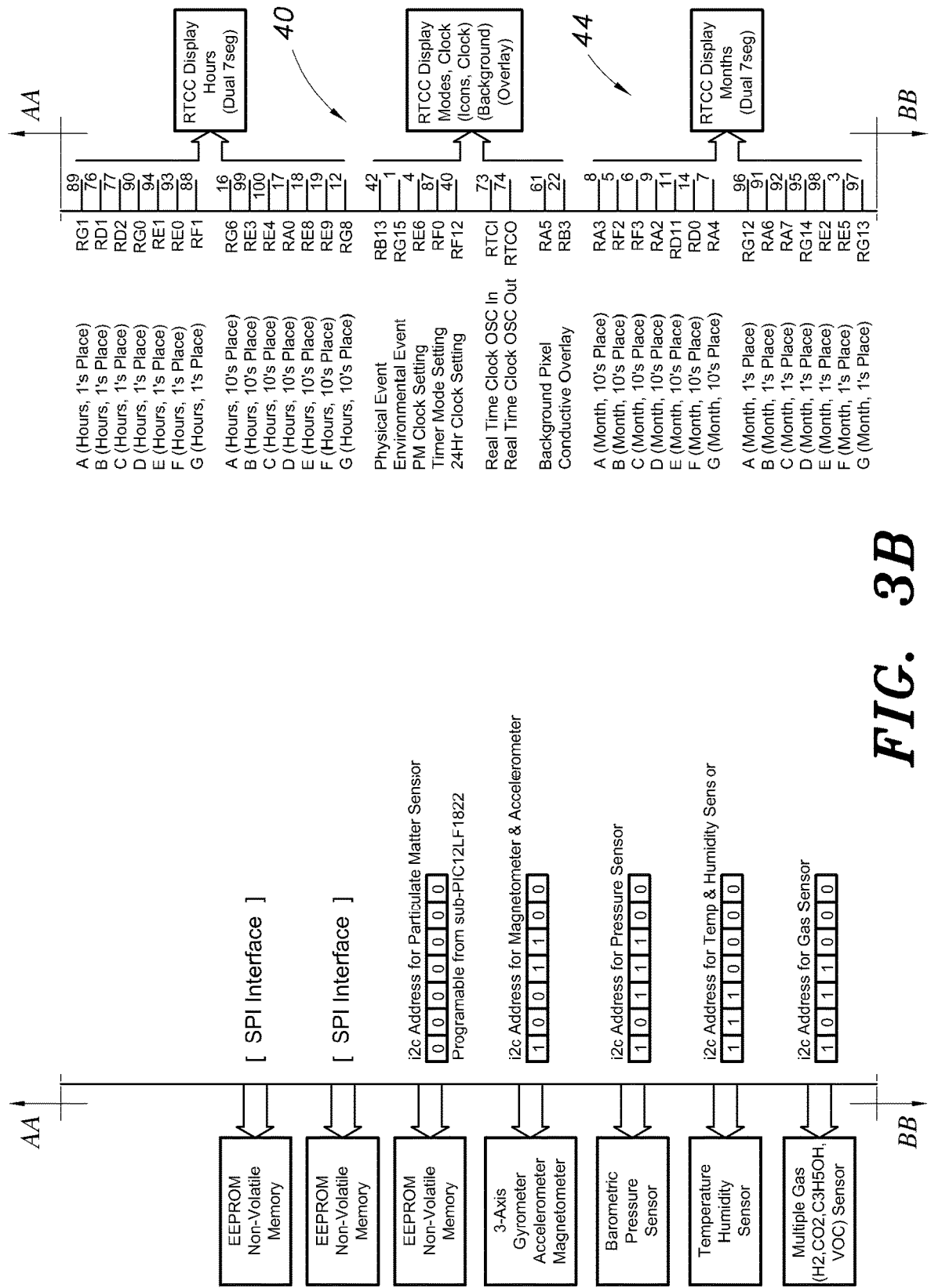
Figure 3C:
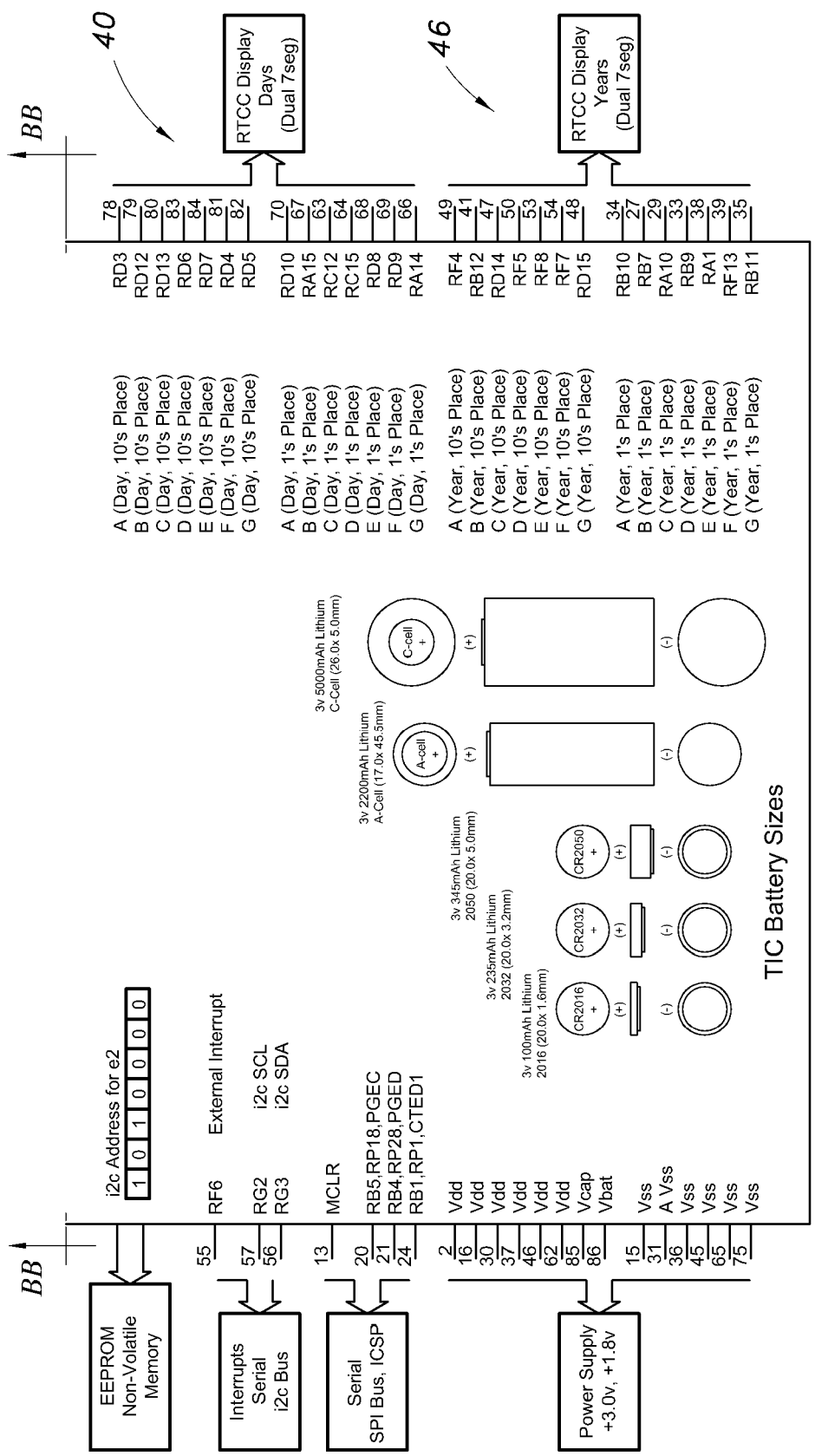

FIG. 3A, FIG. 3B, and FIG. 3C together show a Micro controller block diagram. FIG. 3A shows a microcontroller 40 which runs (operates) the entire device 10. The microcontroller 40 contains embedded code that directs all other sub-components. These sub-components communicate to and from the microcontroller block of FIG. 3A, and the communications are shown at the right hand side of FIG. 3A in a conventional manner for a circuit diagram.

In FIG. 3A, a part numbering system 42 is indicated which is shown inside the outlined portion, and this represents a user table for feature selection. For example, users may not need all of the TIC's sensors or radios, for example, and this allows them to choose. By creating a part number, a user can specify and purchase only the TIC features that they need. This is discussed further below.

FIG. 3B shows the microcontroller 40, and shows connections 44 which are indicated on the right hand side of FIG. 3B. These connections go to a block showing a RTCC ("real time clock calendar") display hours, and to a block showing RTCC display months. These blocks are unnumbered in FIG. 3B.

On the left side of FIG. 3B, connections are shown to three blocks showing EEPROM non-volatile memory, which are unnumbered in this figure. The left side of FIG. 3B also shows a block for a 3-axis gyrometer accelerometer magnetometer, a block for a barometric pressure sensor, a block for temperature humidity sensor, and a block for a multiple gas sensor. These blocks are labeled and are unnumbered in FIG. 3B. The multiple gas sensor handles H2, CO2, C3H50H, and VOC.

FIG. 3C shows a remaining portion of the microcontroller 40, including connections on the right hand side indicated generally at 46. The connections 46 go to the RTCC display days block and to the RTCC display year block, with both blocks being a numbered in this view.

The left side of FIG. 3C shows connections and an "EEPROM non-volatile memory" block, an "interrupts serial i2C bus" block, a "serial SPI bus, ICSP" block, and a power supply block. These blocks are unnumbered in FIG. 3C. The power supply is indicated to be at +3.0 v, and +1.8 v.

A central portion of FIG. 3C shows a number of lithium batteries in different sizes, which are used to power the microcontroller 40 and the TIC sensor 10 overall.

Figure 4A:
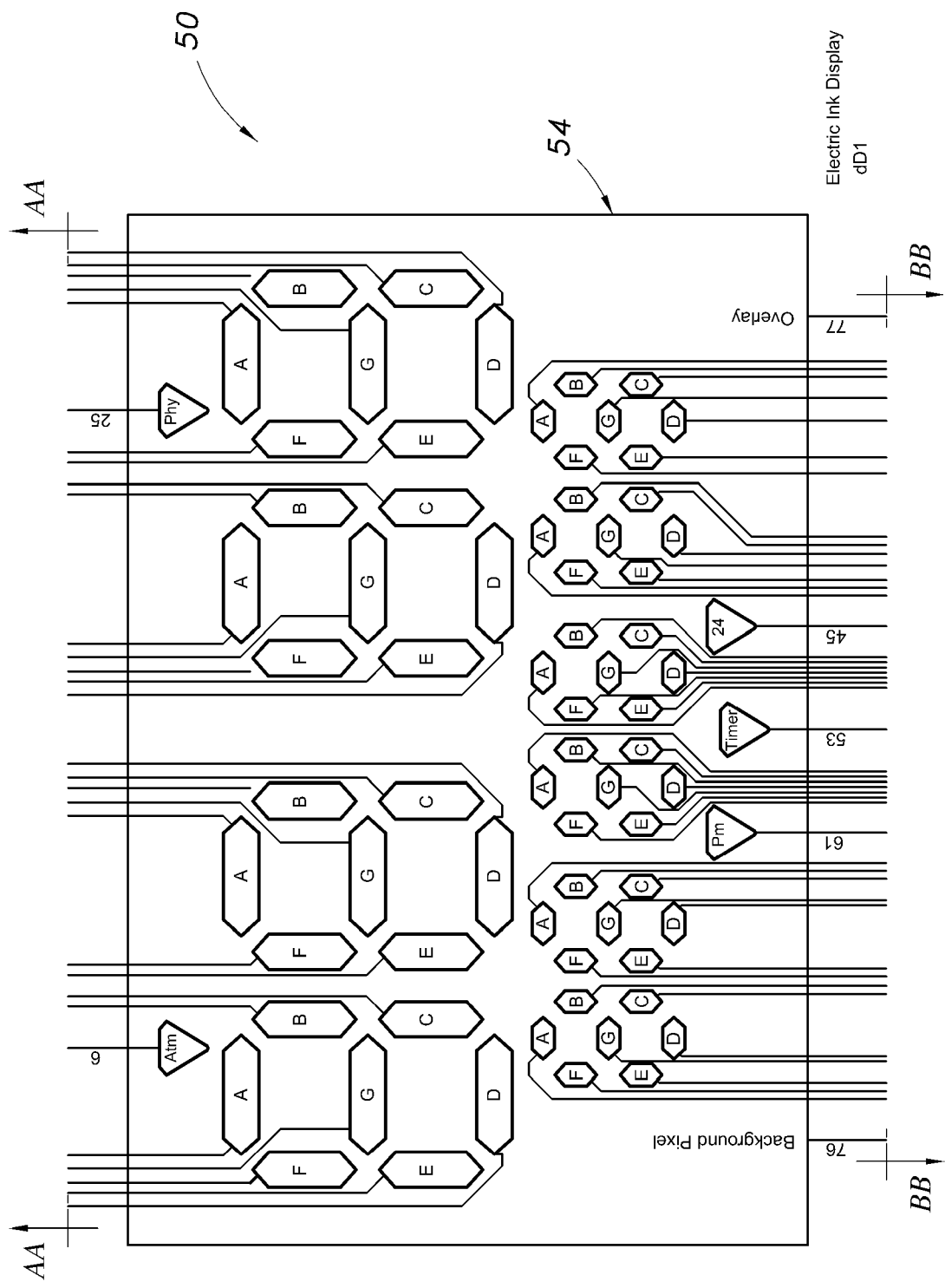
FIG. 4A, FIG. 4B, FIG. 4C, and FIG. 4D together show wiring for the TIC's display segments.

FIG. 4A, FIG. 4B, FIG. 4C, and FIG. 4D together show wiring 50 for the TIC's display segments. A display 54 is shown in FIG. 4A, which represents the tracing from each display pixel and it's connections to the microcontroller 40. These types of displays are well-known in general, and the present invention is not limited to the display shown and is contemplated as including all other types of displays capable of being produced by any one having skill in the electronic display arts.

Figure 4B:
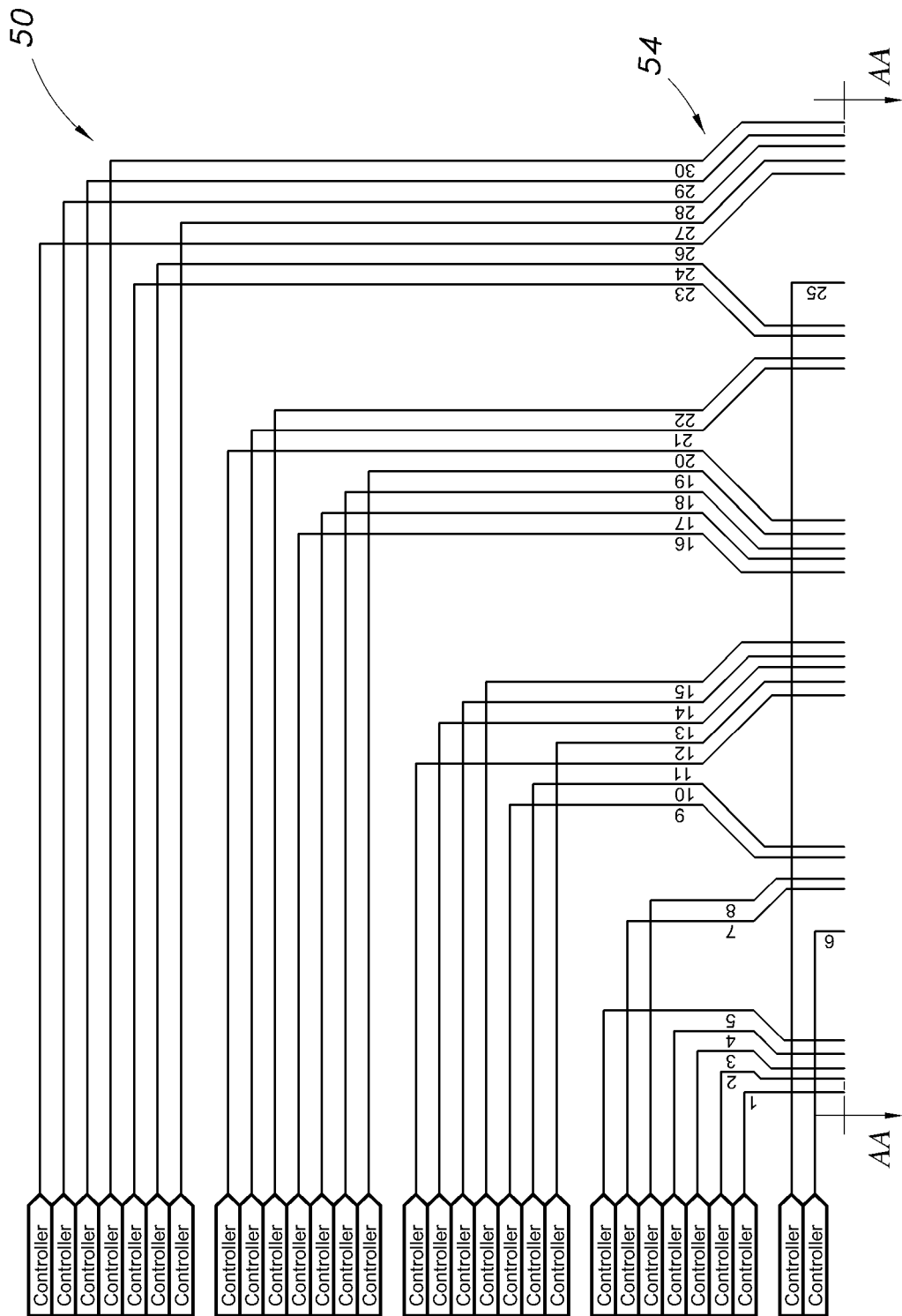

FIG. 4B is a portion of the wiring 50 connecting controllers (unnumbered in FIG. 4B) and specific wiring sections 54 along the bottom of FIG. 4B. The lower portion of FIG. 4B connects with an upper portion of FIG. 4C.

Figure 4C:
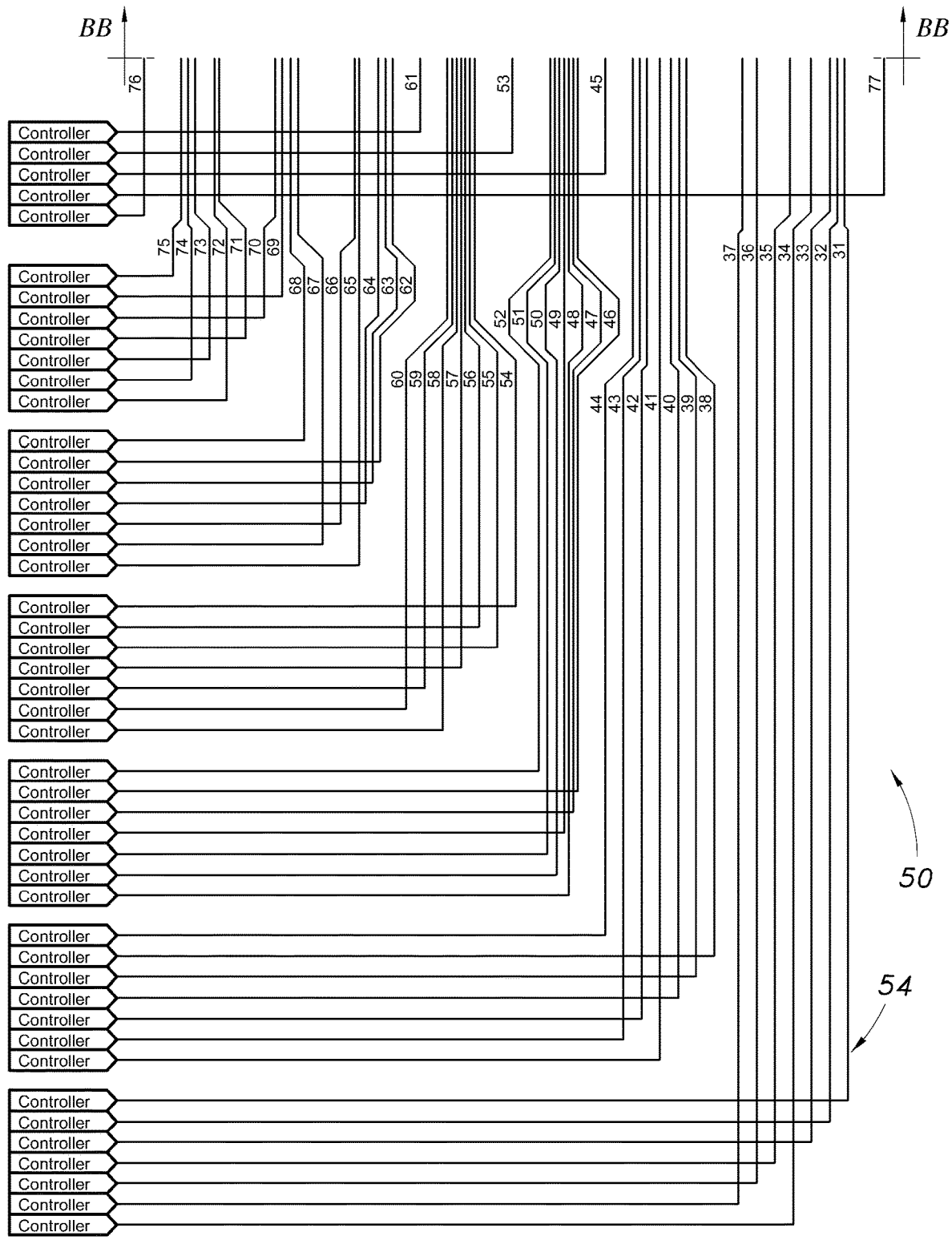

FIG. 4C shows the wiring 50 and the wiring portion 54. In FIG. 4C, controllers are provided for the wiring, and are shown on the left hand side of 4C. The controllers are unnumbered in this view. This view will be understood by any one having skill in the electronic ink display arts and digital display circuit fabrication arts.

Figure 4D:
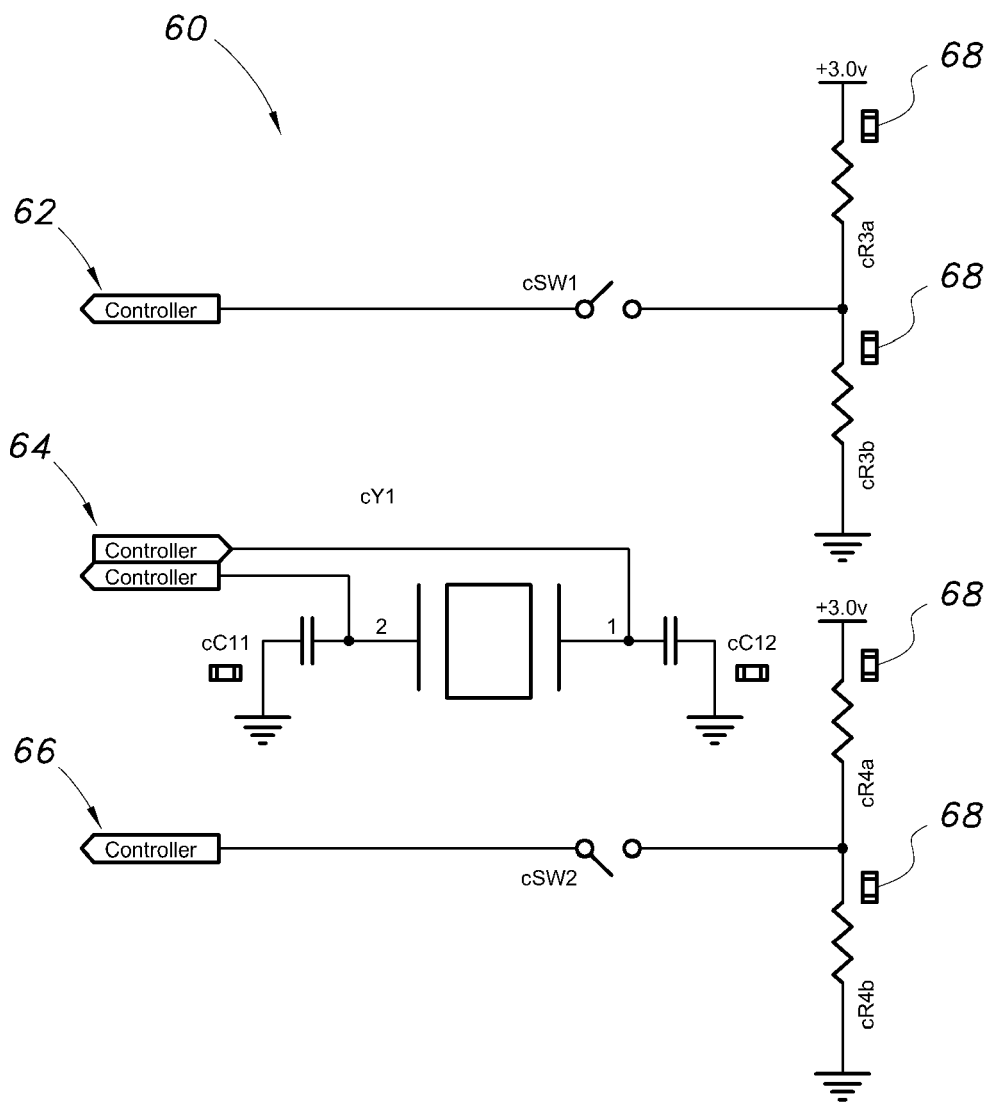

FIG. 4D shows a circuit 60, the circuit 60 having a circuit portion 62 for the SET button, a circuit portion 64 for the NAV button, and a circuit portion 66 for the real-time clock calendar (RTCC) circuit. This represents SET, NAV, and RTCC connections to and from the micro controller 40. The elements 68 show the pull-up and pull-down resistor options for off-state for the SET and NAV circuit portions. Elements 62, 64, and 66 respectively show the SET, NAV, and RTCC wiring to the microcontroller 40.

Figure 5A:
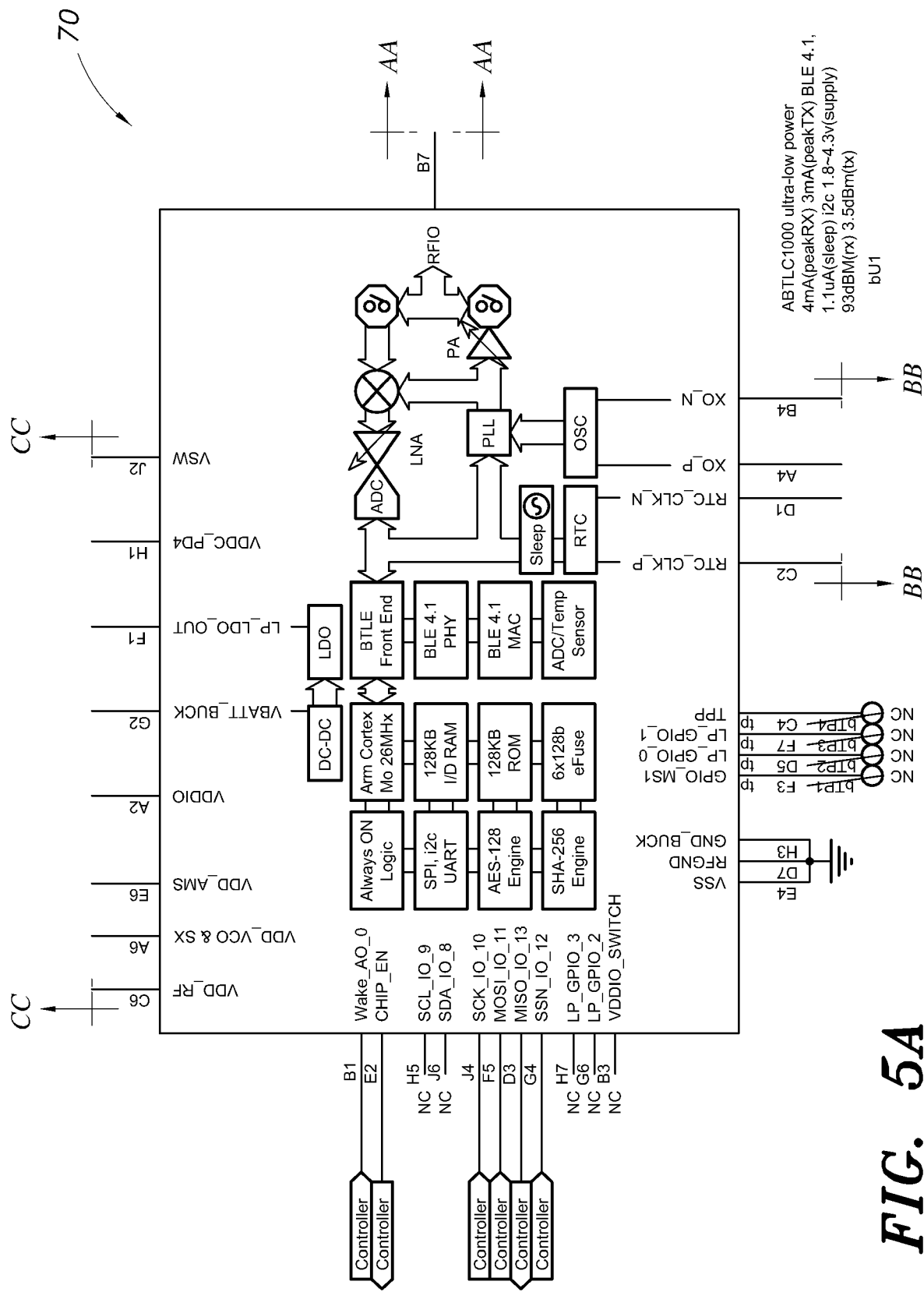
FIG. 5A, FIG. 5B, FIG. 5C, and FIG. 5D together show a BTLE circuit.

FIG. 5A, FIG. 5B, FIG. 5C, and FIG. 5D together show a BTLE circuit 70. The abbreviation BTLE stands for "Bluetooth Low Energy Transceiver". In FIG. 5A, blocks inside the device are labeled and their functions indicated, and the connections among the blocks are shown. A temperature sensor block is shown, as well as a sleep block and BTLE front end block. Any one having skill in a microcontroller fabrication and control arts will understand how to make and use the device shown in FIG. 5A.

Figure 5B:
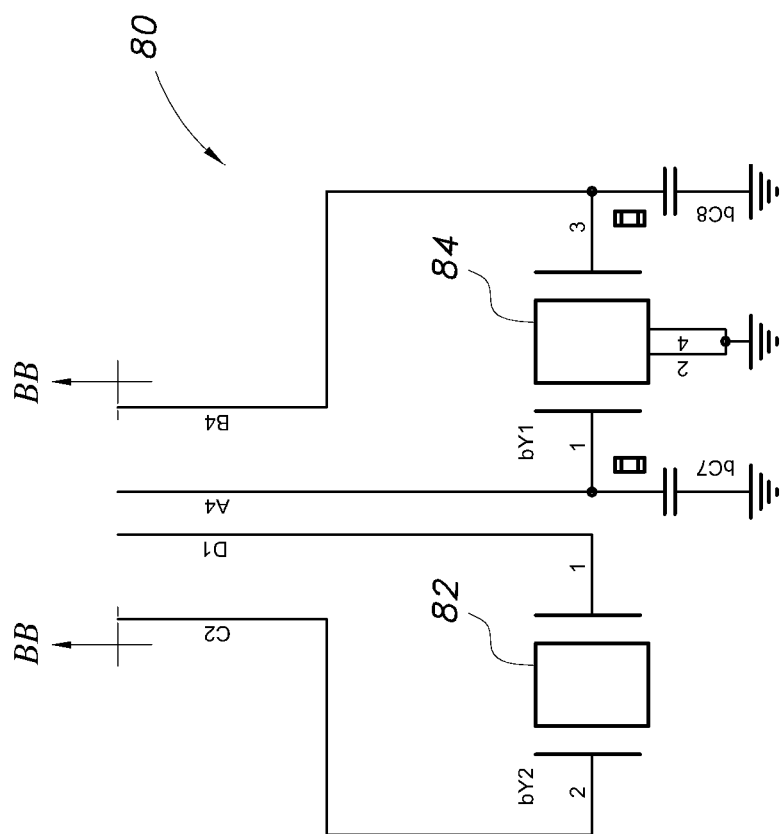

In FIG. 5B a timing circuit 80 is shown, as well as a crystal 82 for real-time frequency and a crystal 84 for operating frequencies.

Figure 5C:
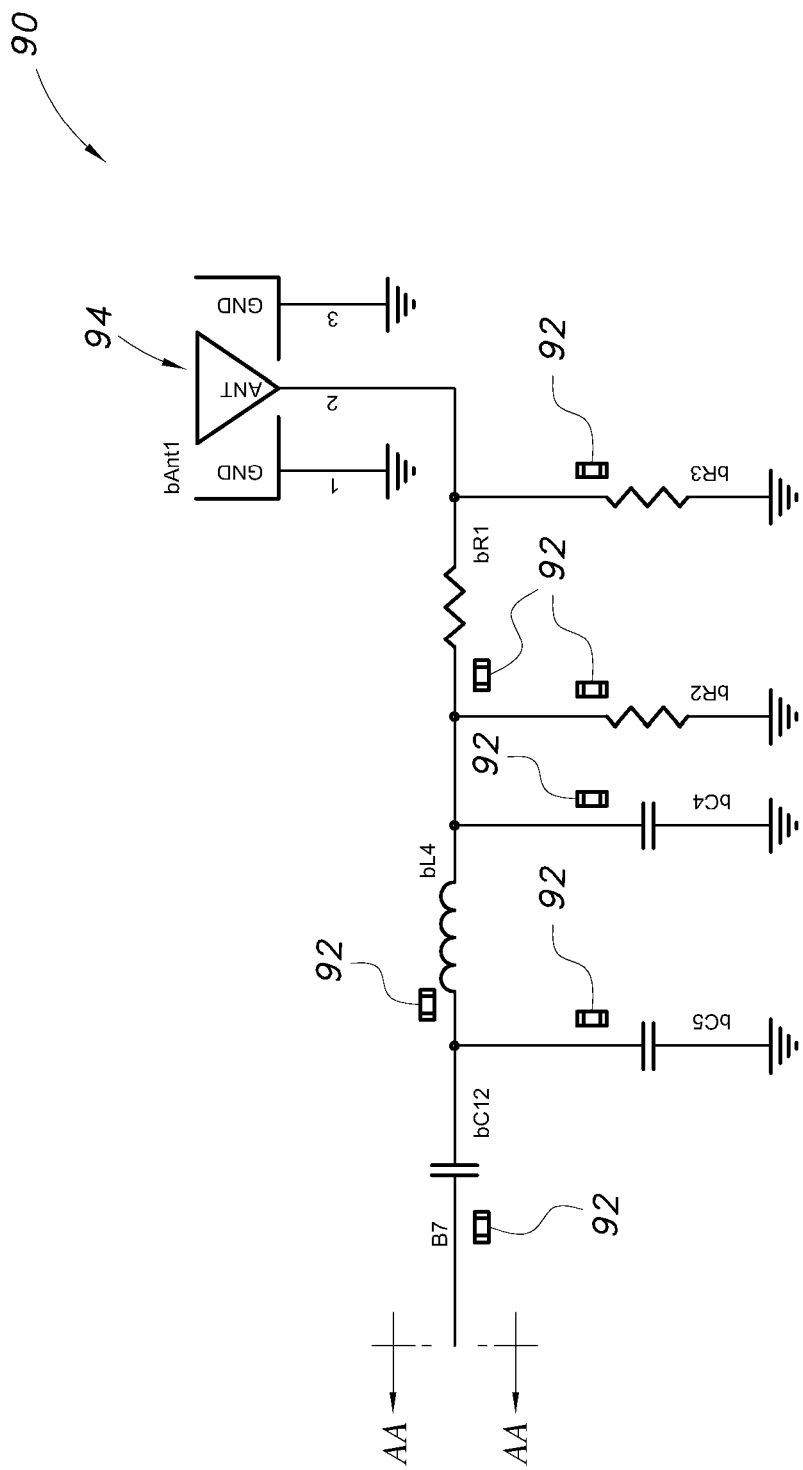

In FIG. 5C, the BPLE's RF path 90 is shown, from the chip to an antenna 94. A number of passive and matching components 92 are shown for the BTLE's RF path 90.

Figure 5D:
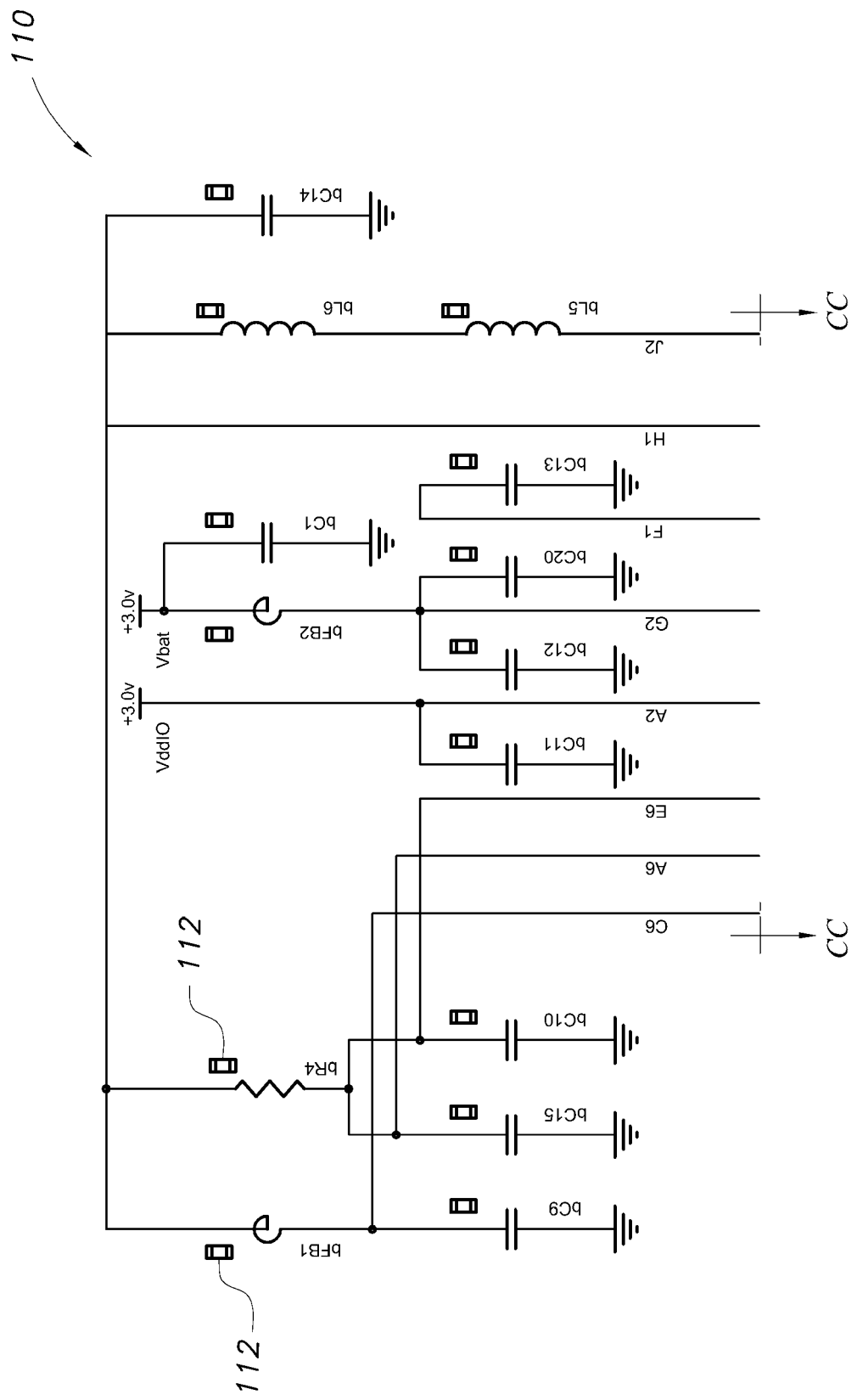

FIG. 5D shows a power supply circuit 110 for the BTLE's power supply. A plurality of passive and matching components 112 are schematically indicated in this view.

Any one having skill in the micro controller fabrication and programming arts can understand, make, and use a circuit corresponding to FIGS. 5A-5D.

The BTLE circuit enables short range communication of data to allow seamless connectivity, and the ease of app development for smart devices, such as mobile phones and tablets. The TIC also embeds one of the world's smallest BTLE transceivers, Atmel's atbtlc1000, which is an ultra-low power Bluetooth® smart (ble 4.1) system on a chip with integrated mcu, transceiver, modem, mac, pa, tr switch, and power management unit (pmu). It can be used as a bluetooth low energy link controller or data pump with external host mcu or as a standalone applications processor with embedded ble connectivity and external memory. The qualified Bluetooth® smart protocol stack is stored in dedicated ROM. The firmware includes l2cap service layer protocols, security manager, attribute protocol (att), generic attribute profile (gatt), and the generic access profile (gap). Additionally, application profiles such as proximity, thermometer, and many others are supported and included in the protocol stack.

FIG. 6A, FIG. 6B, FIG. 6C, and FIG. 6D together show a long range transceiver circuit 120 (also referred to as LoRa circuit 120). This represents a schematic circuit diagram for the TIC's LoRa communication system.

The LoRa circuit 120 includes a protocol engine 122, a LoRa modem 124, and a data buffer 123. An FSK modem block is shown (unnumbered), and an OSC 128 is connected to a PLL 132 and connects to a Matching LPF 130. An element 137 connects to a PLL 132. An element 136 connects to an ADC 133, and other unnumbered elements are shown and labeled. These elements and circuit diagram will be understood by any one having skill in the microcontroller fabrication arts and micro-controller programming arts.

Figure 6A:
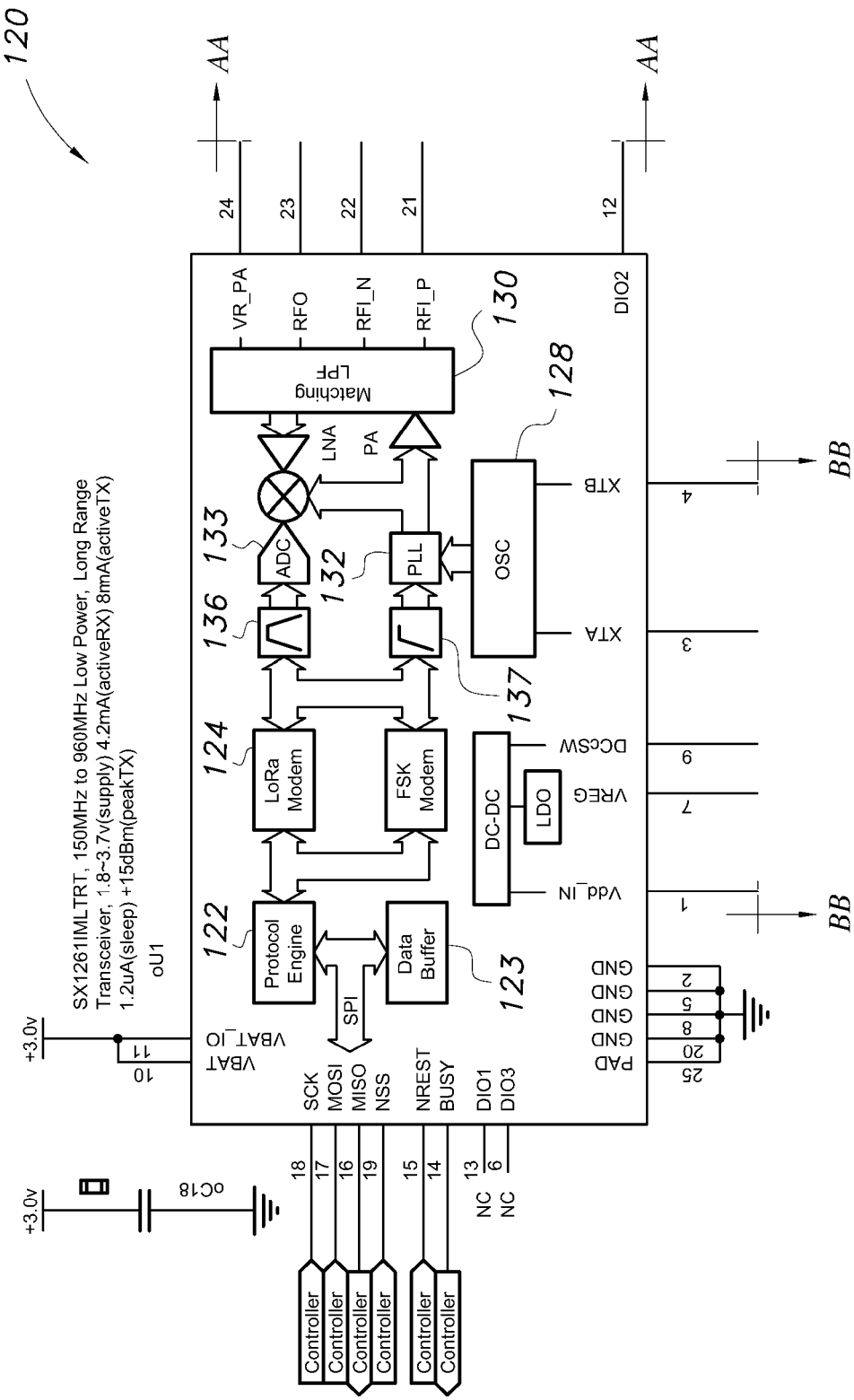
FIG. 6A, FIG. 6B, FIG. 6C, and FIG. 6D together show a long range transceiver circuit (also referred to as LoRa circuit).
Figure 6B:
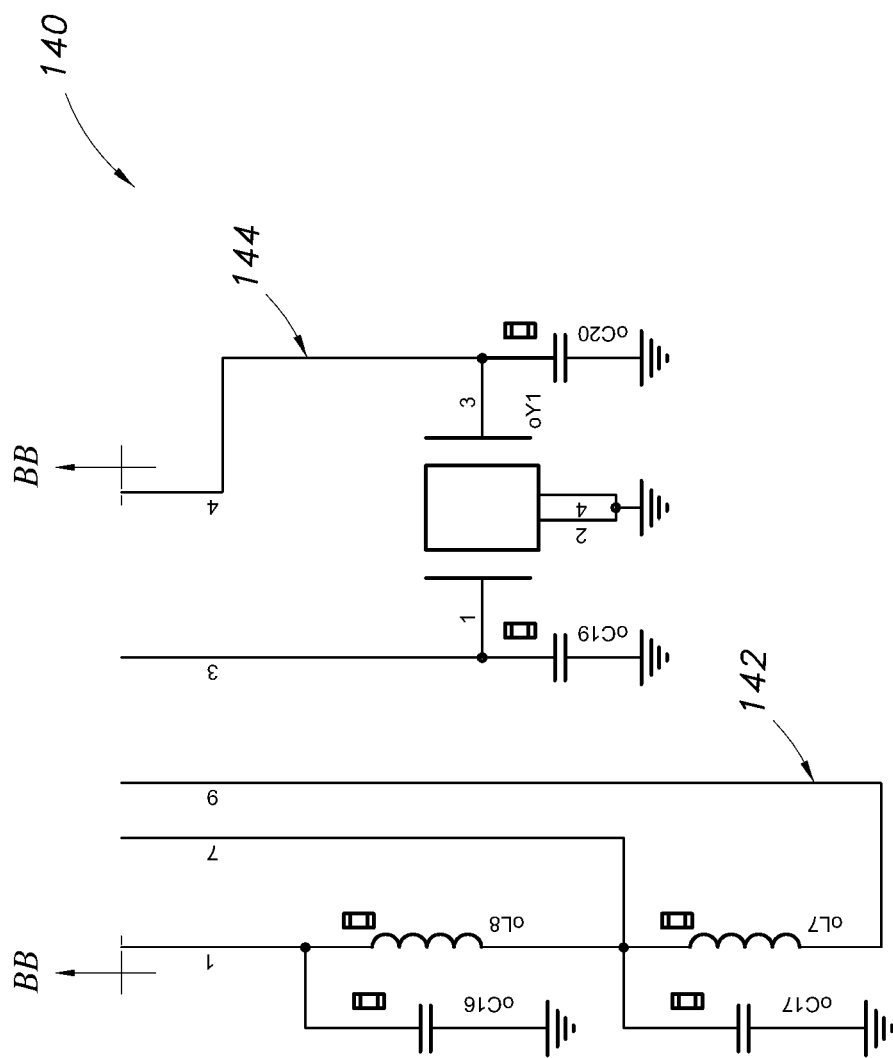

FIG. 6B shows the LoRa's timing circuit 140. A circuit portion 144 is indicated at the right indicating the actual circuit elements as shown. These elements and circuit diagram will be understood by any one having skill in the micro-controller fabrication arts and micro-controller programming arts.

Figure 6C:
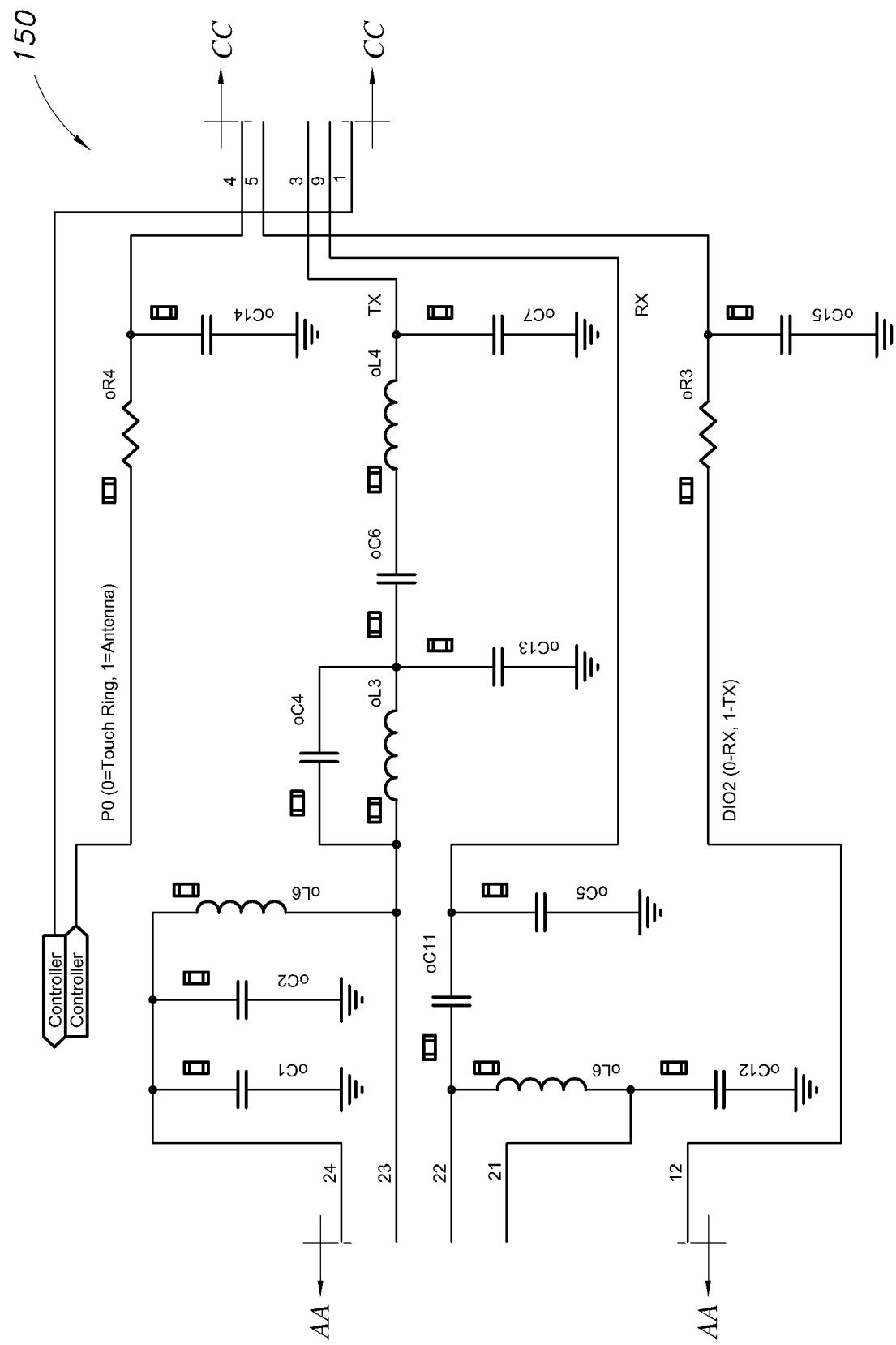

FIG. 6C shows a LoRa RF path 150, of the LoRa circuit 120 of FIG. 6A. The circuit elements are as shown and labeled in this view, and these elements and circuit diagram will be understood by any one having skill in the micro-controller fabrication arts and micro-controller programming arts.

Figure 6D:
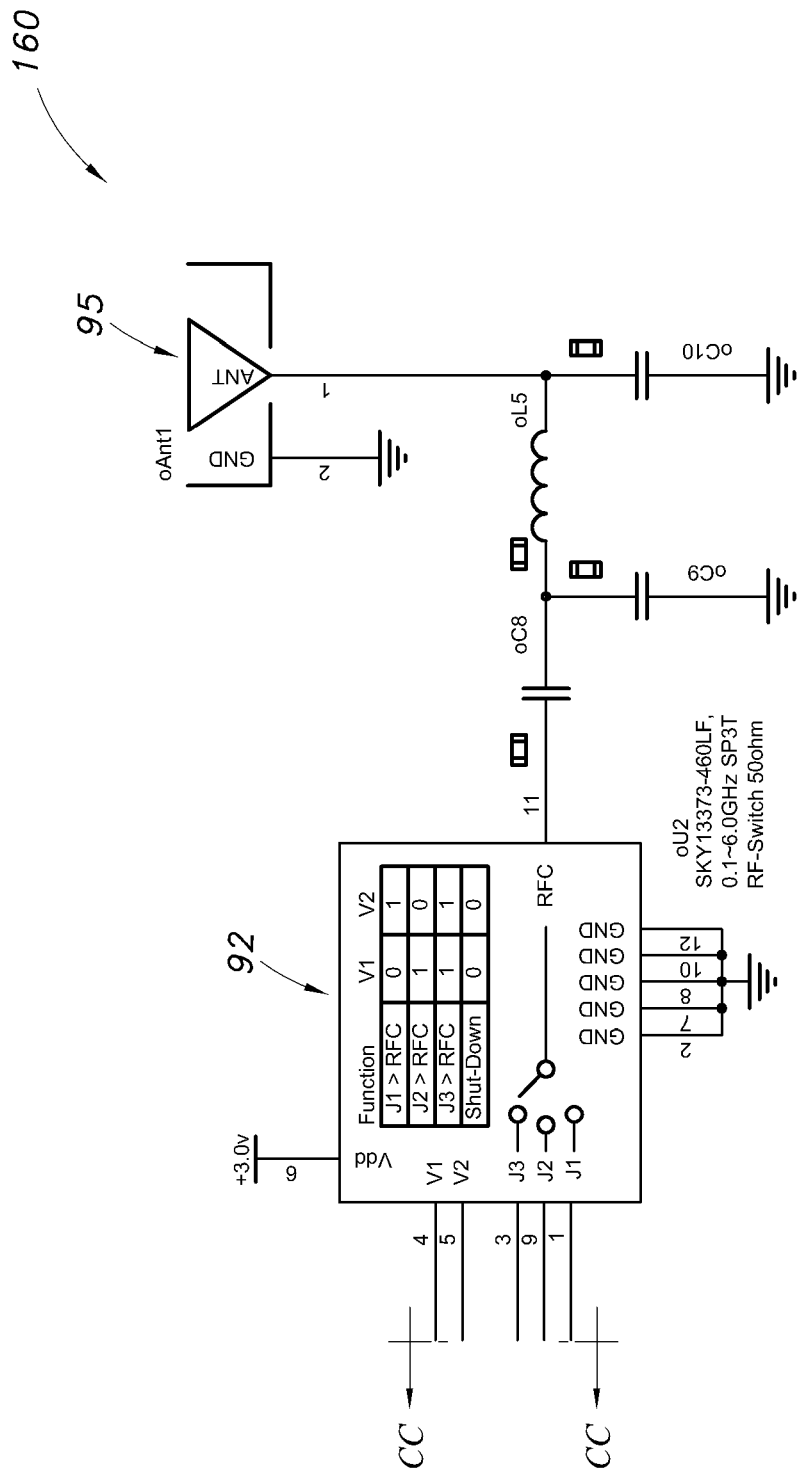

FIG. 6D shows a passive and matching components circuit portion 160 of the LoRa circuit 120. This circuit portion 160 is in the LoRa's RF path. These components include an RF switch 92 for engaging an antenna 95 to receive, transmit, or touch.

Figure 7:
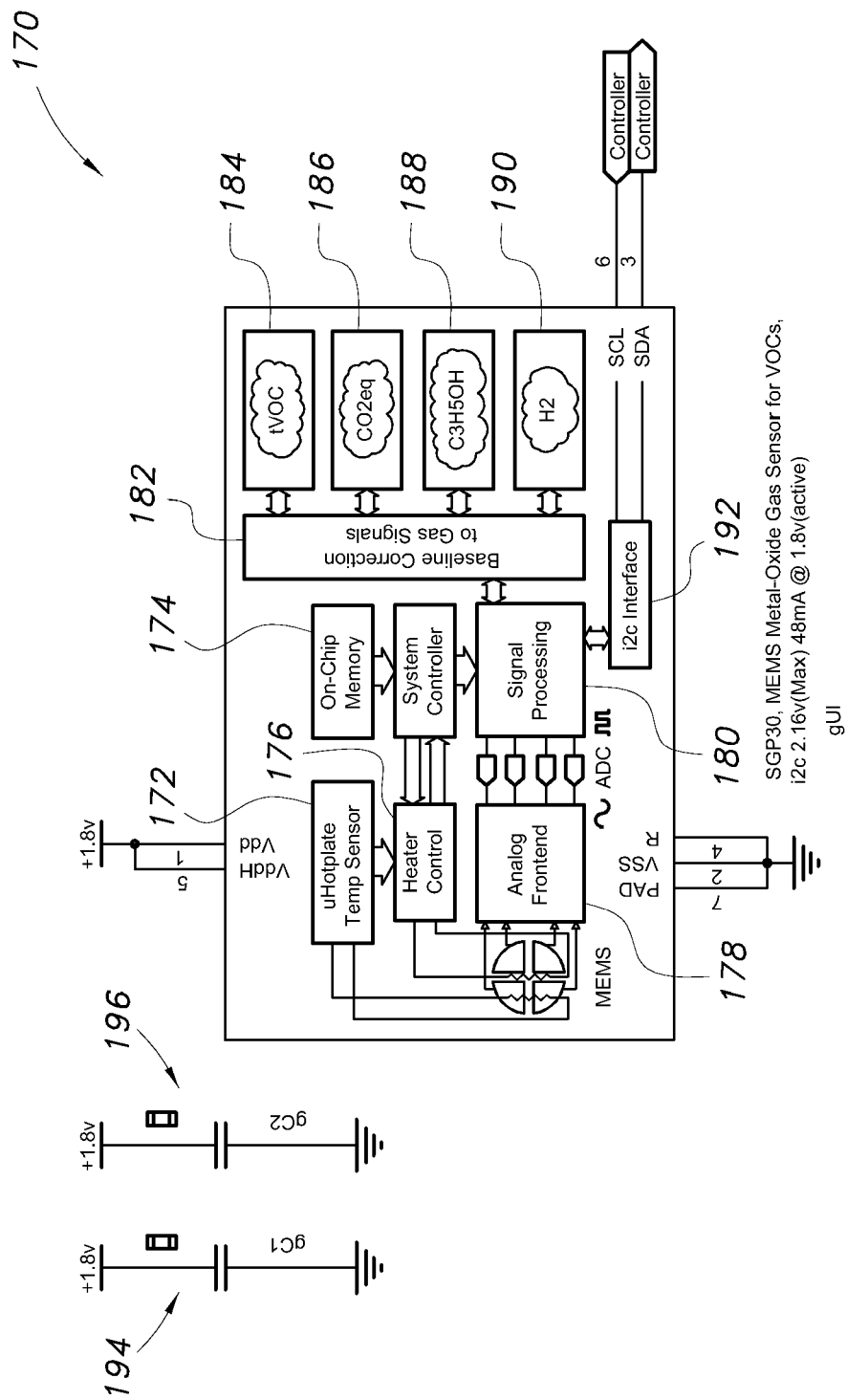
FIG. 7 shows a multi-gas sensor circuit.

FIG. 7 shows a multi-gas sensor circuit 170. The circuit 170 includes bypass capacitors 194 and 196 in the gas trips supply voltage. The multi-gas sensor circuit 170 includes a temperature sensor 172, a heater control 176, an analog front end 178, an on-dash trip memory 174, a system controller (unnumbered), and a signal processing block 180.

The circuit 170 also includes an interface 192, a block 182 for a baseline correction to gas signals, the block 182 communicating with each of blocks 184, 186, 188 and 190 which respectively are for tVOC, CO2eq, C3H50H, and H2. Other components are labeled as shown, and will be understood by any one having skill in the microcontroller fabrication and programming arts.

Figure 8A:
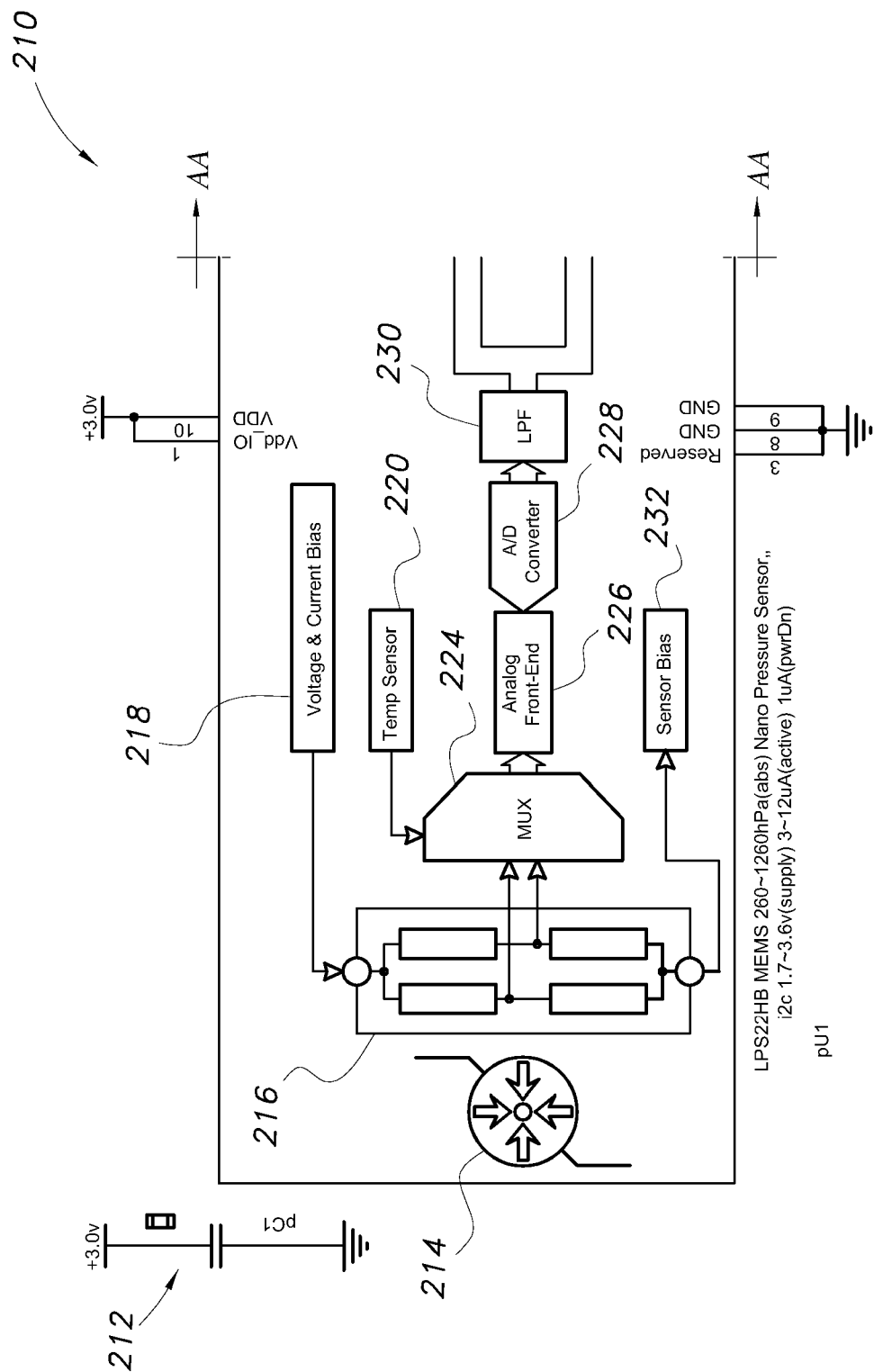
FIG. 8A and FIG. 8B together show a pressure sensor circuit.
Figure 8B:
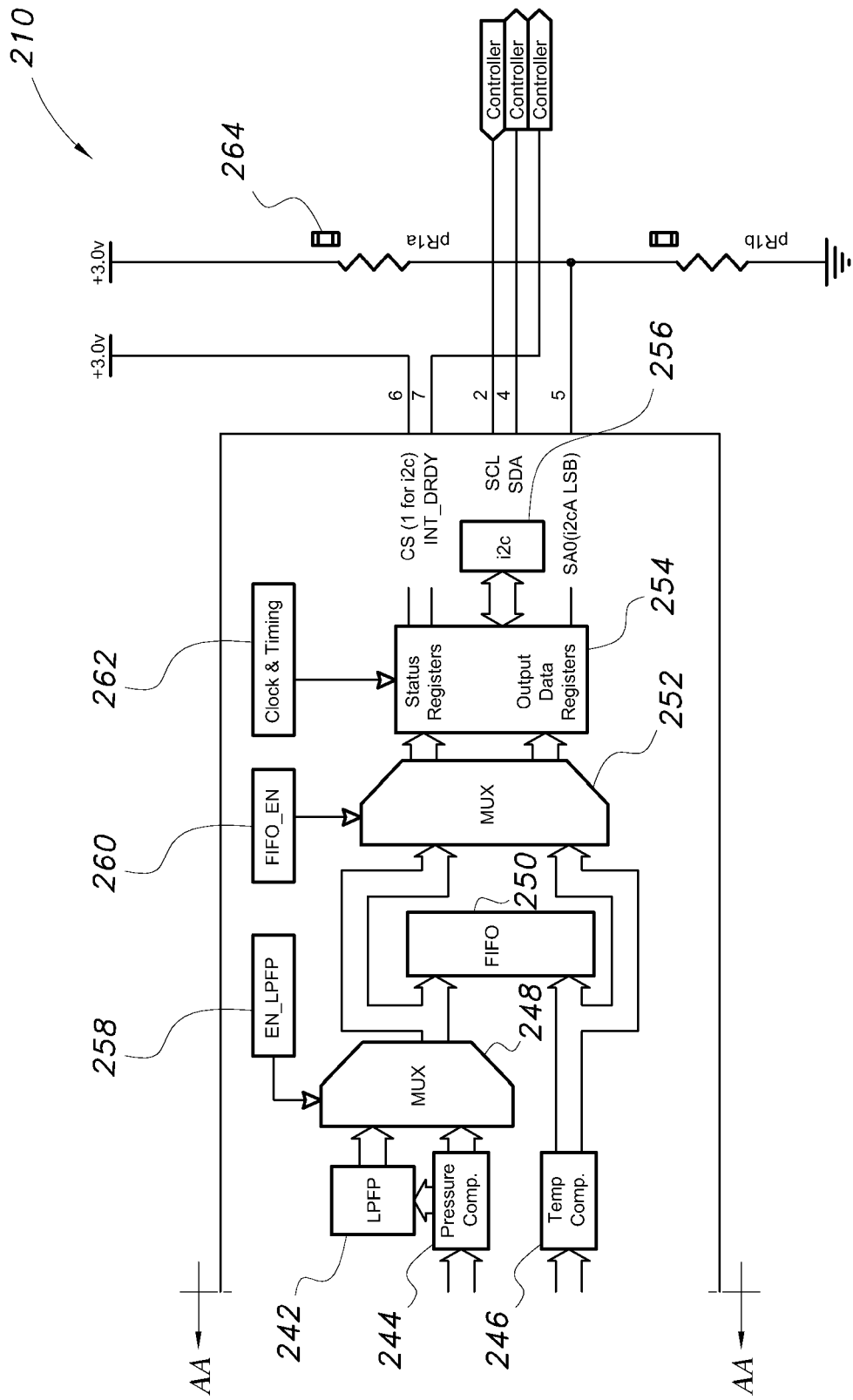

FIG. 8A and FIG. 8B together show a pressure sensor circuit 210. A bypass capacitor 212 is shown in the pressure chip's supply voltage. The circuit 210 includes a voltage and current bias 218, a circuit portion 216 communicating with an MUX 224. A temperature sensor 220 communicates with the MUX 224. A sensor bias 232 is provided as well. An analog front end 226 communicates with an A/D converter 228 and an LPF 230. Other circuit elements shown and labeled will be understood by any one having skill in the microprocessor fabrication and programming arts.

FIG. 8B shows another portion of the circuit 210, including an LPFP 242, a pressure pump block 244, and a temperature comp block 246. An MUX 248 is shown, which is connected to an FIFA 250 and a further MUX 252, and from there to a block 254 having status registers and output data registers. A block EN_LPFP 258 is connected to the MUX 248. A block FIFO_EN 260 is connected to the MUX 252. A clock and timing block 262 is connected to the block 254. An i2c block 256 communicates with the block 254. Elements 264 (two are shown in FIG. 8B) represent typical passive and matching components which may be required in this circuit.

Figure 9:
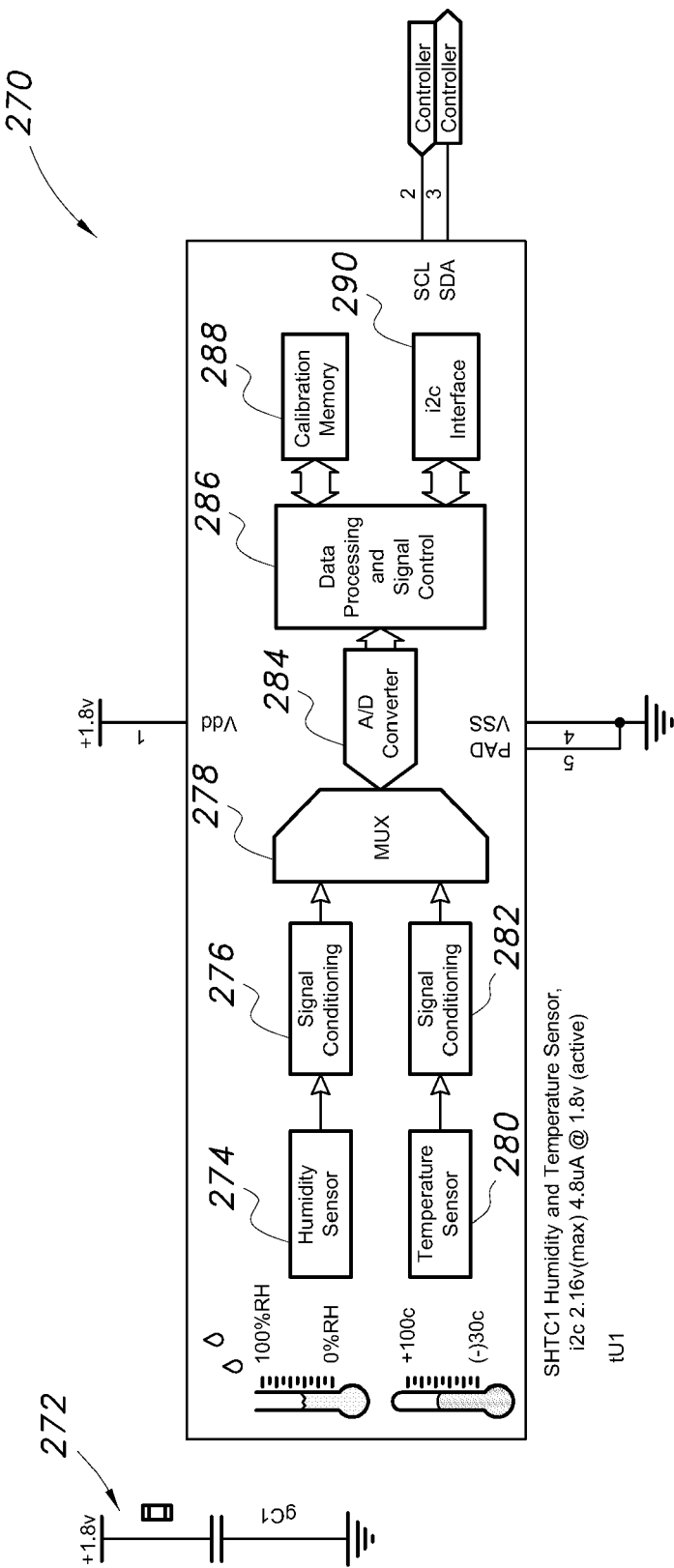
FIG. 9 shows a temperature and humidity sensor circuit.

FIG. 9 shows a temperature and humidity sensor circuit 270. The circuit 270 includes a bypass capacitor 272 in the supply voltage for the circuit 270. The circuit 270 further includes a humidity sensor 274, a signal conditioning block 276, and an MUX 278, an A/D converter 284, a data processing and signal control block 286, a calibration memory 288, and an ITC interface 290. The circuit 270 also includes a temperature sensor 280 and a signal conditioning block 282 which is connected to the MUX 278.

Figure 10A:
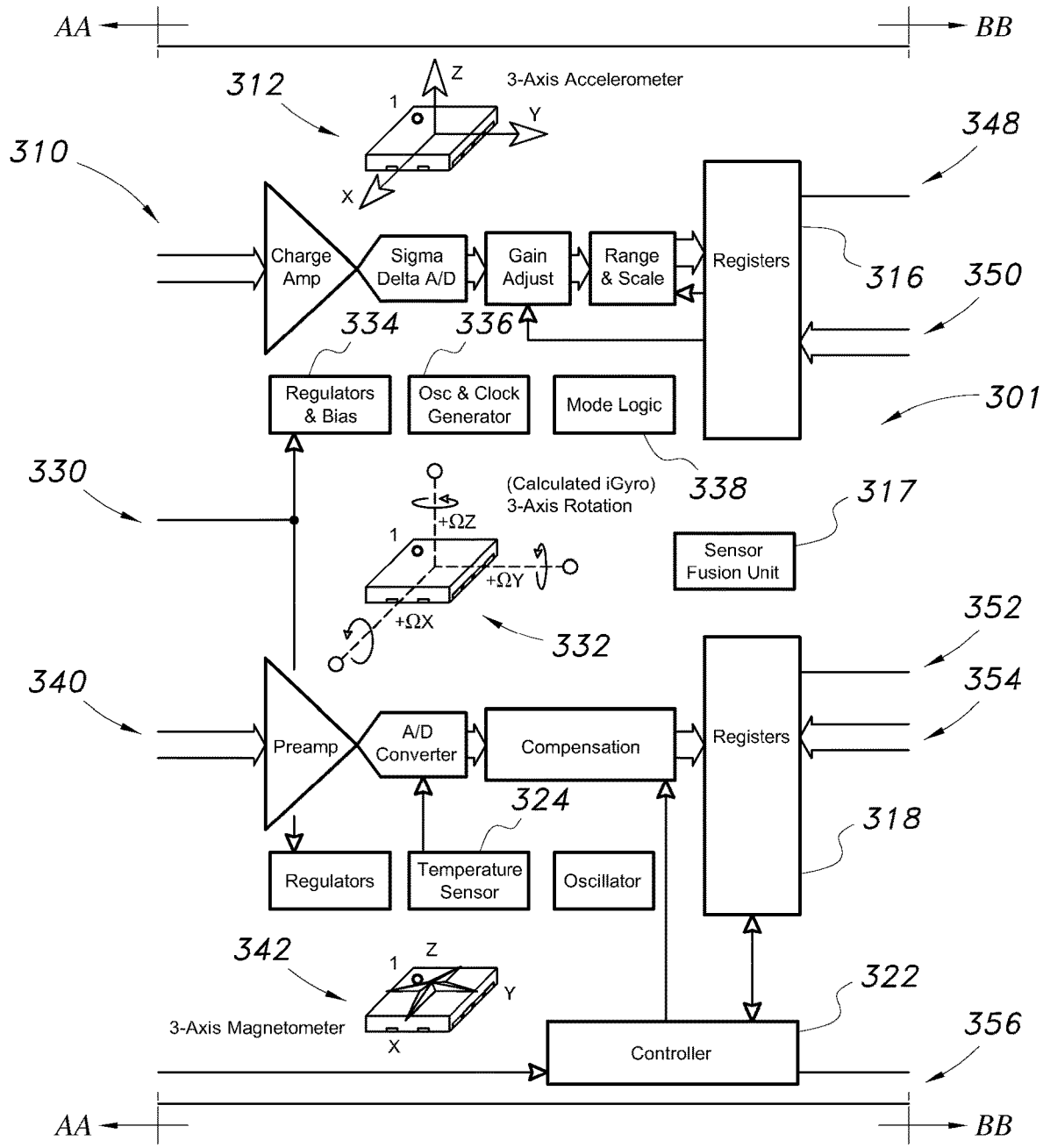
FIG. 10A, FIG. 10B, FIG. 10C, and FIG. 10D together show a physical sensor circuit.

FIG. 10A, FIG. 10B, FIG. 10C, and FIG. 10D together show a physical sensor circuit 301. FIG. 10A shows a 3-axis acceleration sensor circuit 310, a 3-axis direction sensor circuit 330, and a 3-axis magnetometer sensor circuit 340. A schematic image of a 3-axis accelerometer 312 is shown with directions x, y, and z indicated thereon. A 3-axis gyration sensor 332 is schematically shown with rotational axes indicated. And, a 3-axis magnetometer sensor 342 is schematically shown indicating three magnetic axes.

The physical sensor circuit 301 includes a controller 322 having an output indicated at 356. The circuit 301 includes registers 318, a connection 354 and a connection 352 which are connected as shown in FIG. 10C. A temperature sensor 324 is provided, connected to an A/D converter. A sensor fusion unit 317 is schematically indicated. A mode logic 338 is also indicated schematically. An OSC & Clock generator 336 is shown, together with a "regulators and bias" element 334.

The circuit 310 includes a charge amp, a sigma Delta A/D, a gain adjust, and a "range and scale" block (unnumbered in FIG. 10C). These elements connect with registers 316, the registers 316 connecting as shown and indicated by numerals 348 and 350, to elements shown in FIG. 10C as shown and as described further below.

The circuit 340 includes a preamp, an A/D converter, a compensation block, and registers 318. The circuit 340 further includes regulators, a temperature sensor, and an oscillator. The registered 318 communicate with a controller 322. The circuit portion 356 is indicated extending from the controller 322 to FIG. 10B.

Figure 10B:
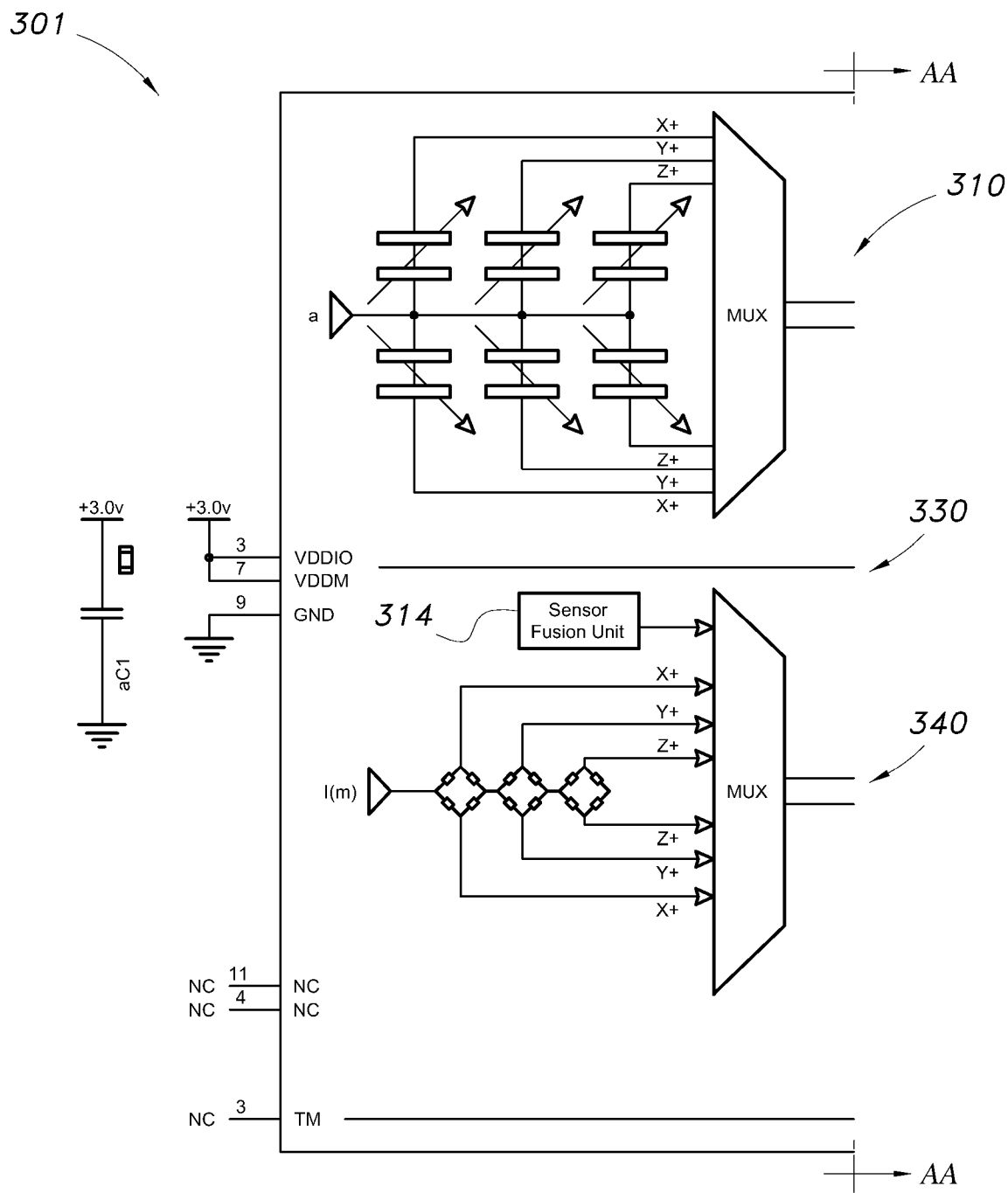
Figure 10C:
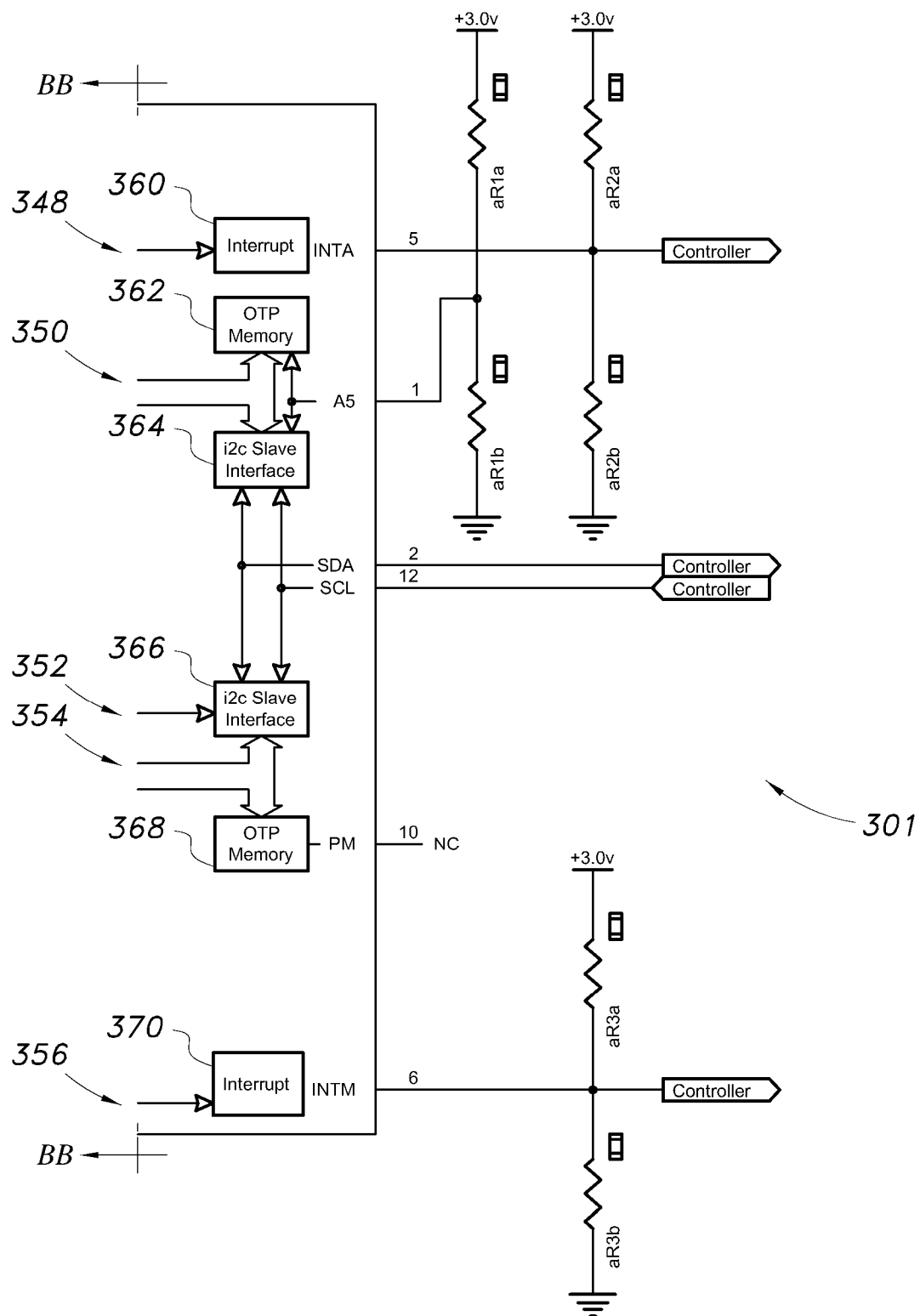

FIG. 10B shows the circuit 301, including the left portions of the circuits 301, 330, and 340. A sensor fusion unit 314 in the circuit portion 340 is shown connected to a MUX (unnumbered in this figure). There is also a MUX (unnumbered) in the circuit portion 310.

FIG. 10C shows the right hand portion of the circuits of FIG. 10A, the connections 348, 350, 352, 354, and 356 corresponding to those of FIG. 10A. The connection 356 is to an interrupt 370. The connection 352 is to a slave interface 366, while the connection 354 goes to both an OTP memory 368 and to the slave interface 366. The connection 350 goes to both an OTP memory 362 and to a slave interface 364. The connection 348 goes to an interrupt 360. These elements connect to the other circuit elements shown, and this diagram will be understood by any one having skill in the micro controller fabrication arts and micro controller programming arts.

Figure 10D:
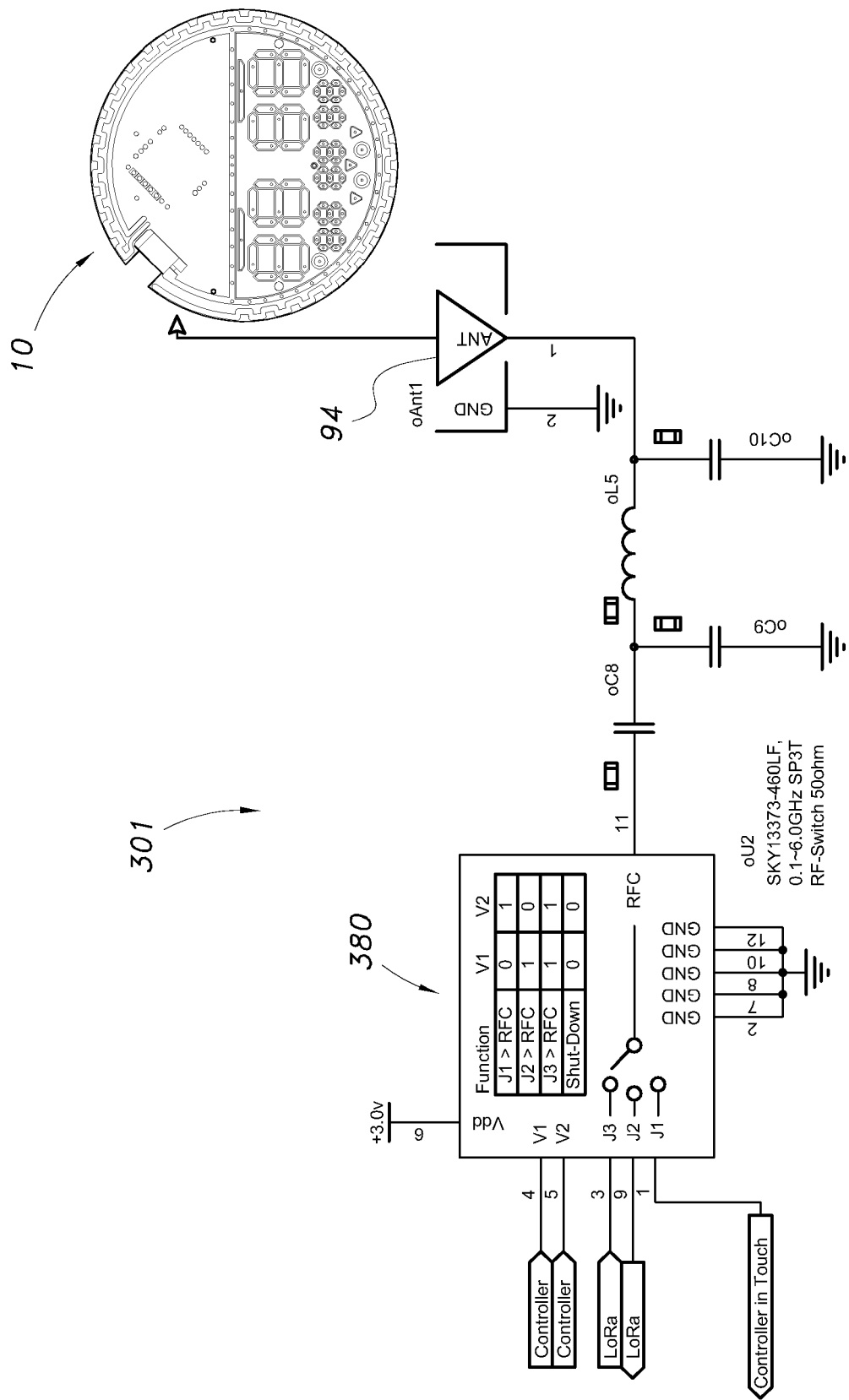

FIG. 10D shows a remaining portion of the circuit 301, including an RF switch 380 for engaging an antenna 94 to receive, transmit, or touch (i.e. respond to touch). The device 10 is indicated pictorially in this view, to indicate a physical location and appearance of the device 10 containing the antenna 94 and the circuit elements described above.

FIG. 11A, FIG. 11B, FIG. 11C, FIG. 11D, FIG. 11E, FIG. 11F, and FIG. 11G together show a particulate matter circuit 401.

Figure 11A:
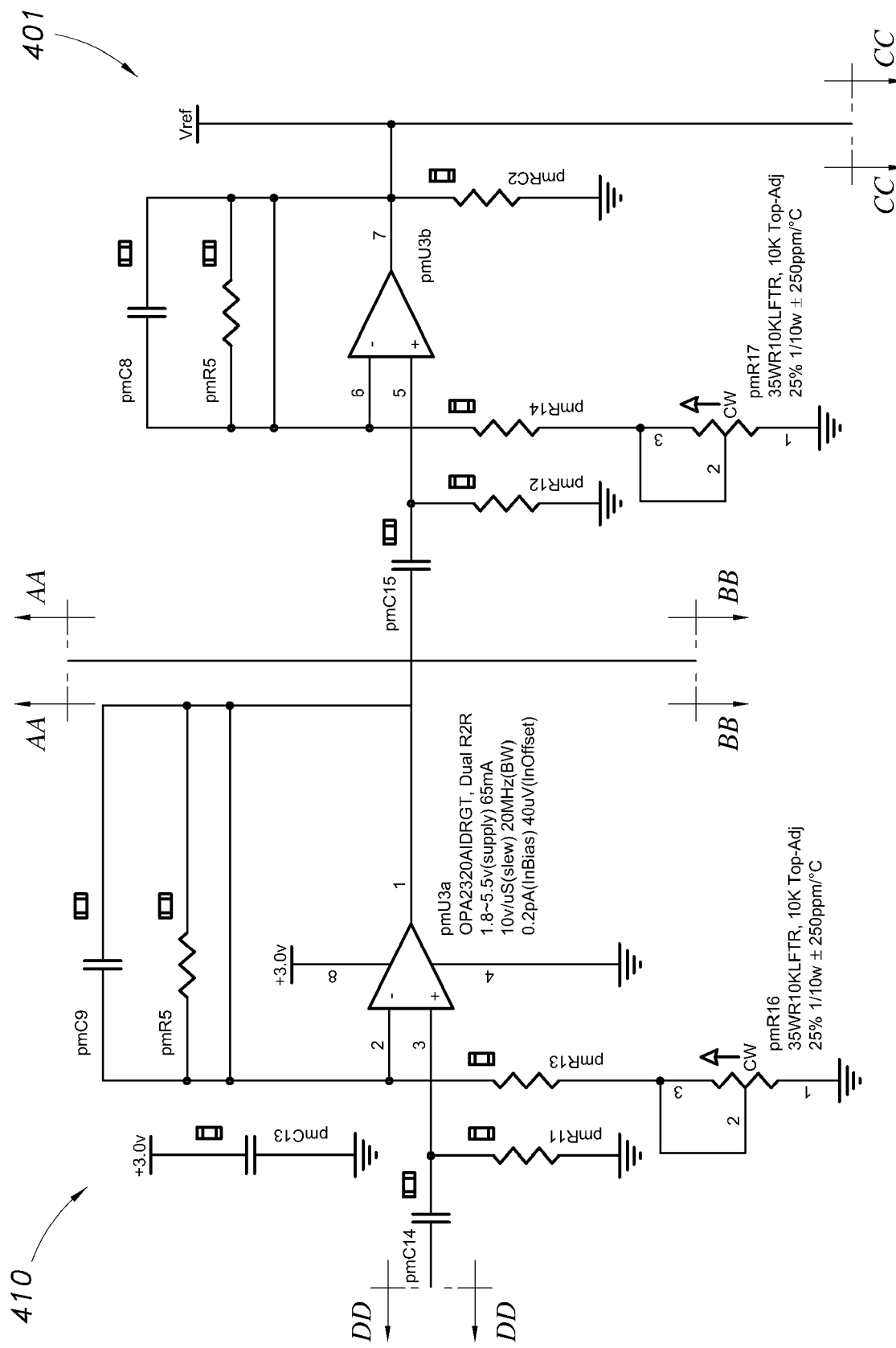
FIG. 11A, FIG. 11B, FIG. 11C, FIG. 11D, FIG. 11E, FIG. 11F, and FIG. 11G together show a particulate matter circuit.

In FIG. 11A, a final gain and trimming stage 410 is shown for the circuit 401.

Figure 11B:
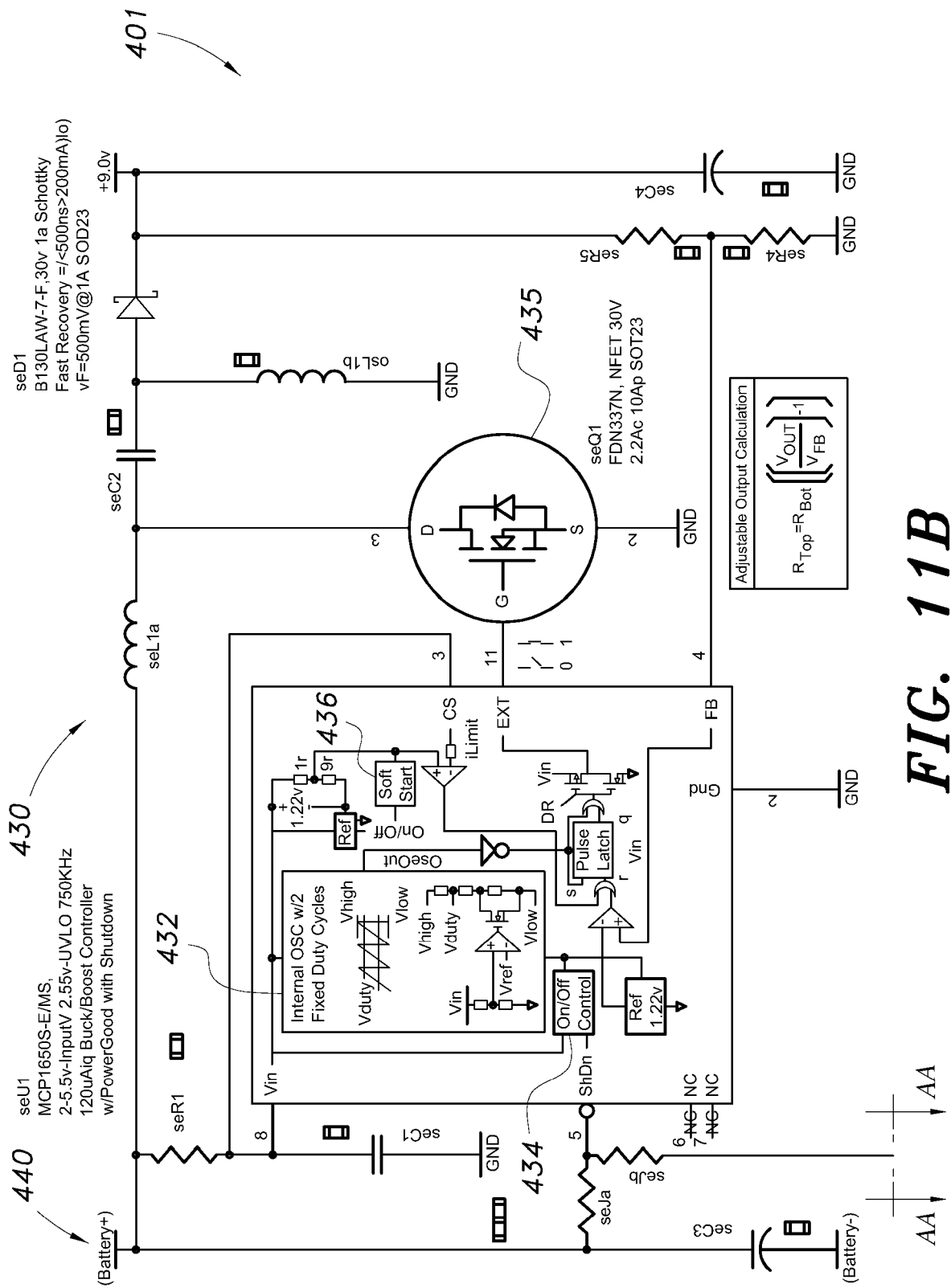

In FIG. 11B, a power supply 430 is shown together with an element 435, and an element 432 and a soft start 436. FIG. 11B schematically indicates connection to a battery input supply 440 to the power supplies DC/DC converter. Also shown is an on-off control 434.

Figure 11C:
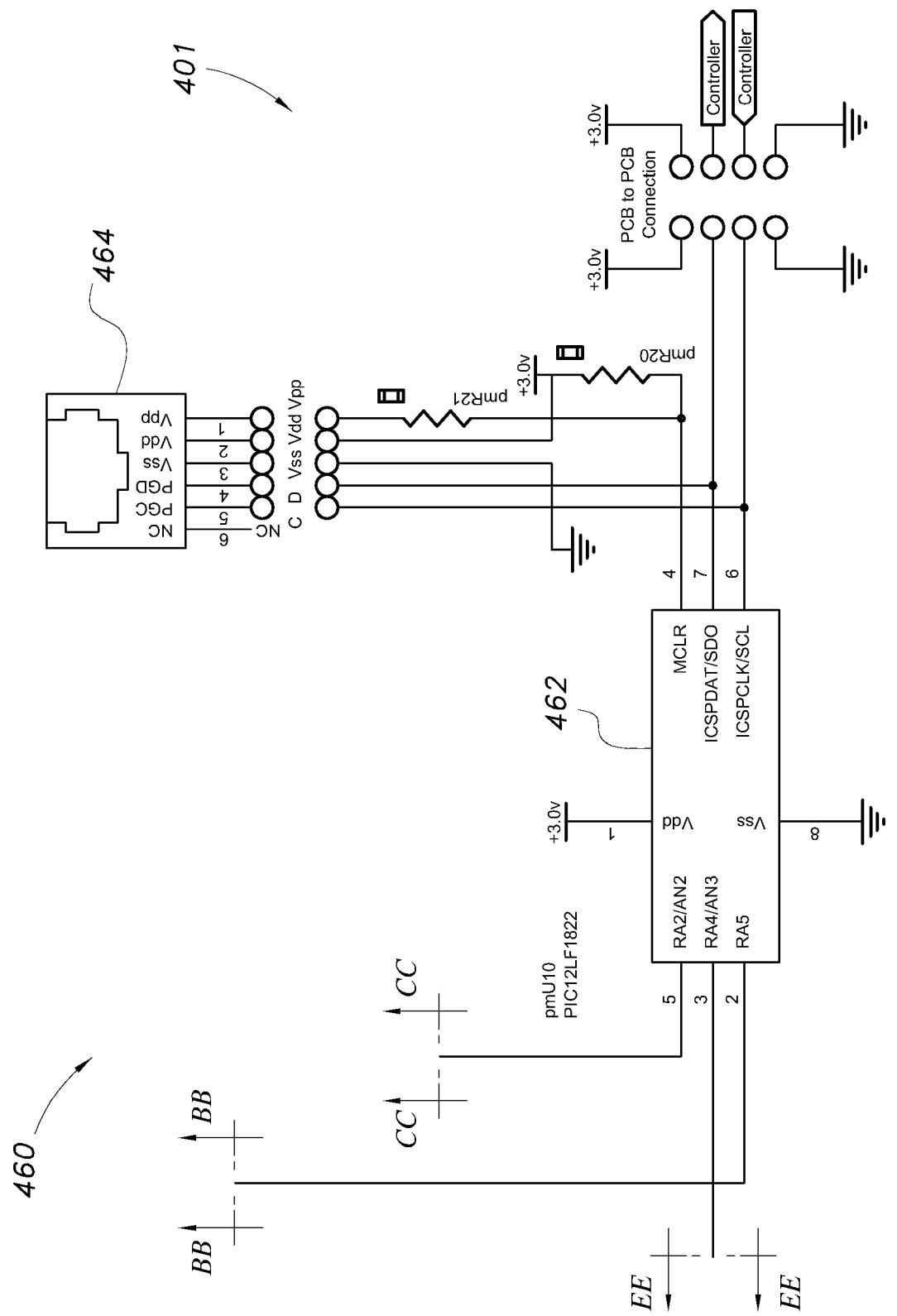

FIG. 11C shows a circuit portion 460 of the circuit 401, and includes a programming port 464 for a sub-microcontroller chip. Element 462 is an 8-bit chip in a sub-microcontroller circuit.

Figure 11D:
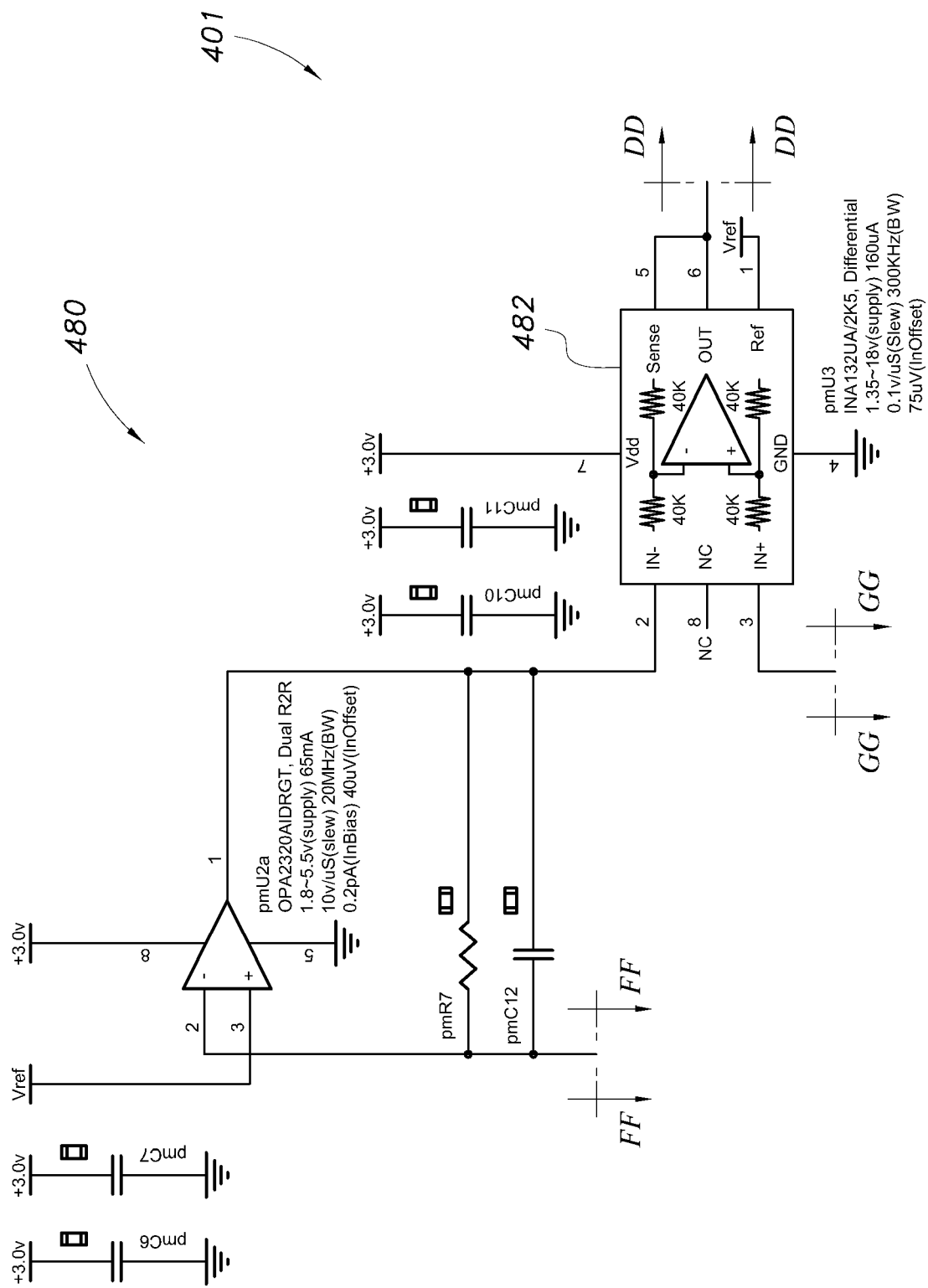

FIG. 11D shows a circuit portion 480 of the circuit 401, and includes a differential OpAmp chip used in a differential amplifier circuit.

Figure 11E:
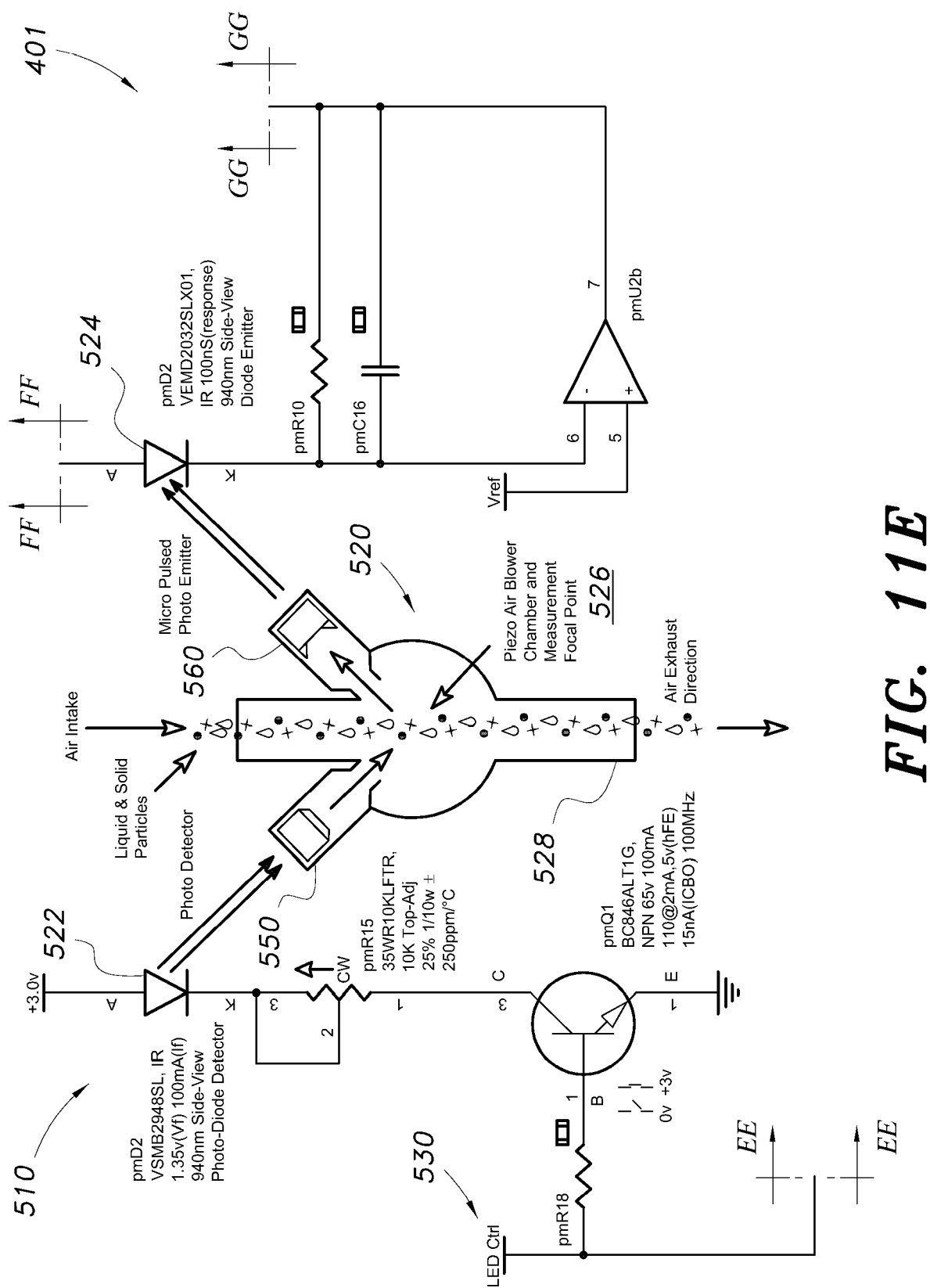

FIG. 11E shows a physical apparatus 520 which is a schematic depiction of an optical detection stage air flow chamber having an air intake and an air exhaust. In this view, liquid and solid particles are schematically indicated passing through the optical detection stage air flow chamber. An infrared emitter 522 supplies an input to branch 550 of the optical detection stage 520. An arm 560 extends from the optical detection stage 520, and directs light using a microphoto-emitter to an infrared detector 524. A piezo air blower chamber and measurement focal location 526 is indicated in the region of the center of the chamber 520. Element 530 is a part of an LED control circuit, and element 550 is part of the infrared emitter circuit for the element 522. An air exhaust passes through an exit arm 528 of the chamber 520.

Figure 11F:
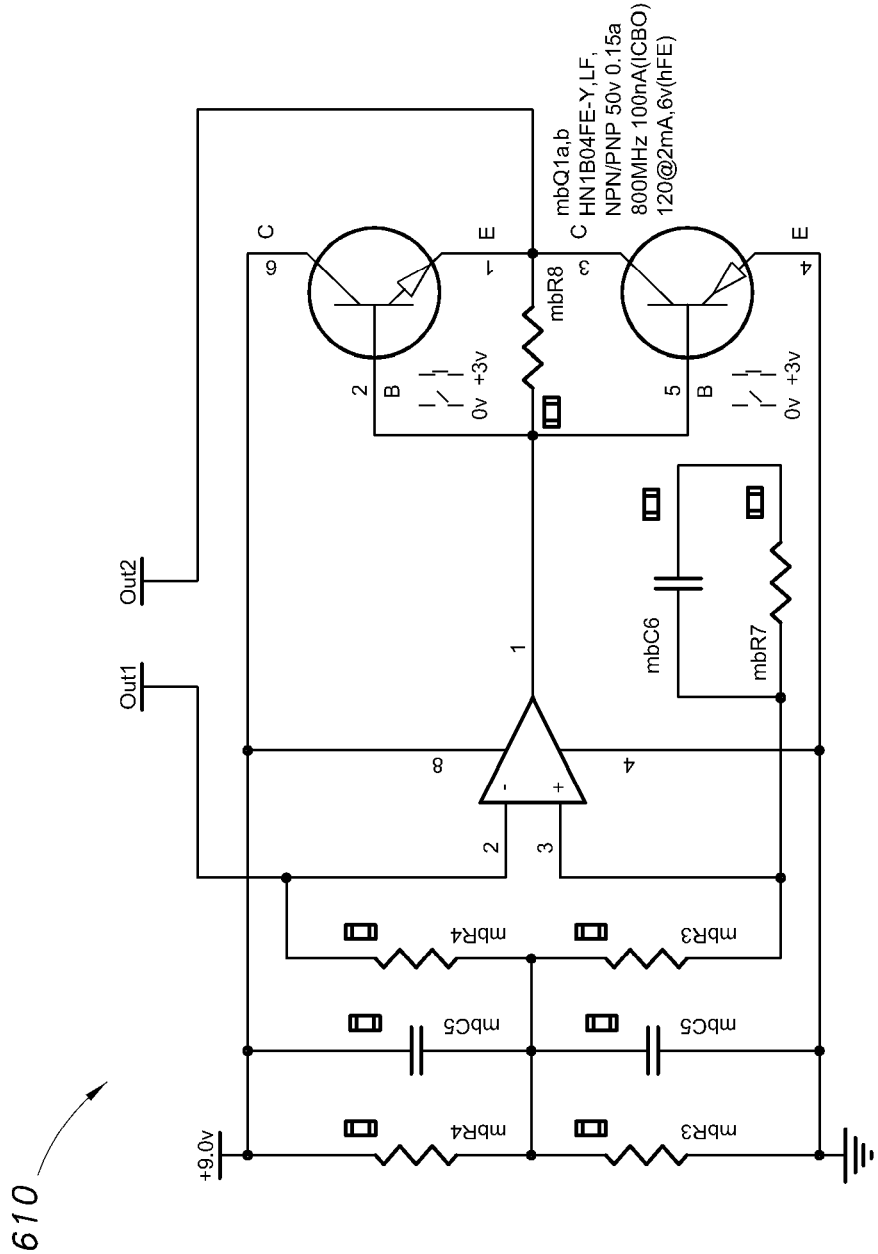

FIG. 11F shows a circuit portion 610 of the circuit 401. The elements are discussed in the foregoing as well as in the following discussion.

Figure 11G:
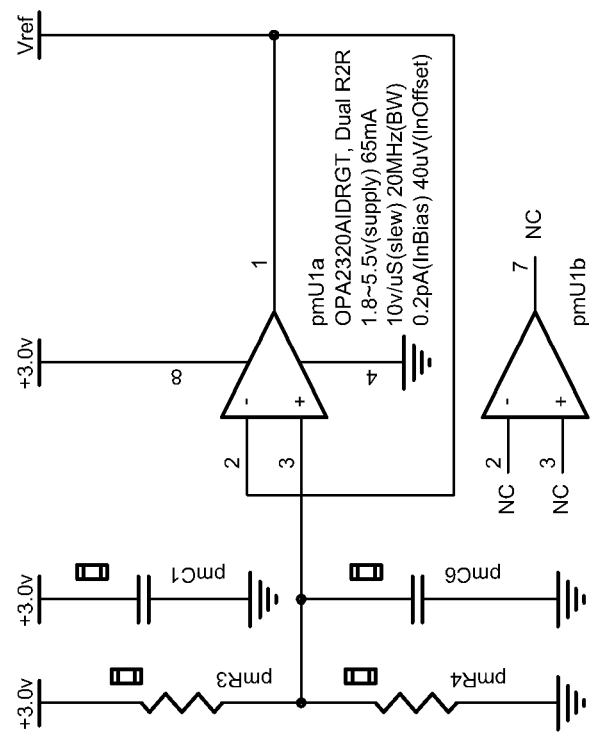

FIG. 11G shows a circuit portion 620 of the circuit 401. Element 435 is a power FET used to switch the power supplies DC/DC converter. Elements 522 and 550 together are the optical detection stages infrared emitter, while elements 524 and 560 are the optical detection stages for the infrared detector. Element 530 is the optical detection stages adjustable voltage for the emitter.

In FIG. 11A through FIG. 11G, the following elements are shown. Reference blocks 432 through 436 inside the power supply DC/DC converter trip itself. Element 435 is the power FET used to switch the power supplies DC/DC converter. Element 440 is the battery input supply, element 462 is the 8-bit chip in the power supply. Element 482 is a differential OpAmp chip, and element 520 is a block reference to the optical detection stage's air flow chamber. Element 530 is the optical detection stage's adjustable voltage for the emitter.

Figure 12A:
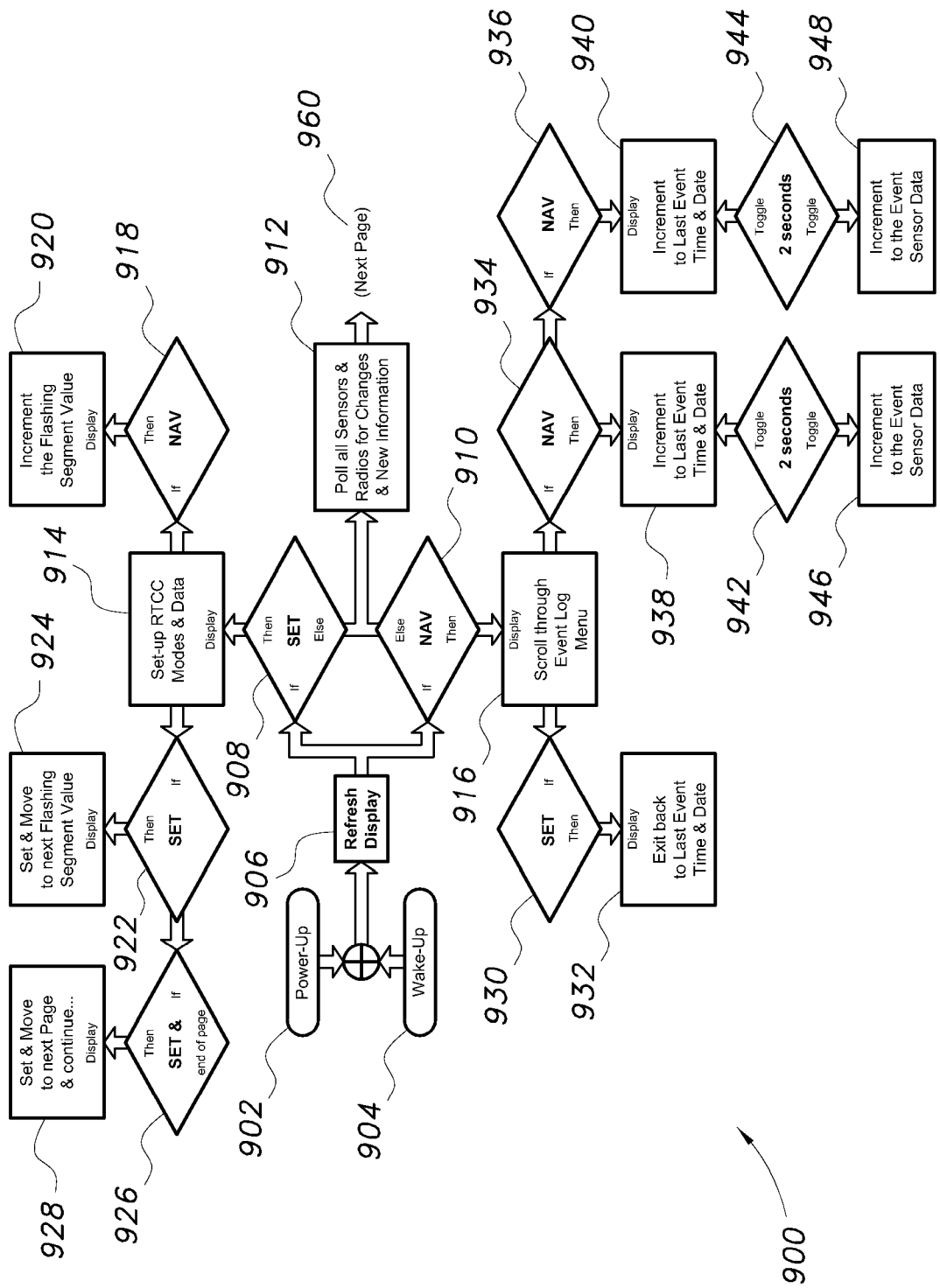
FIG. 12A and FIG. 12B together form a flow chart showing operation of the present invention.
Figure 12B:
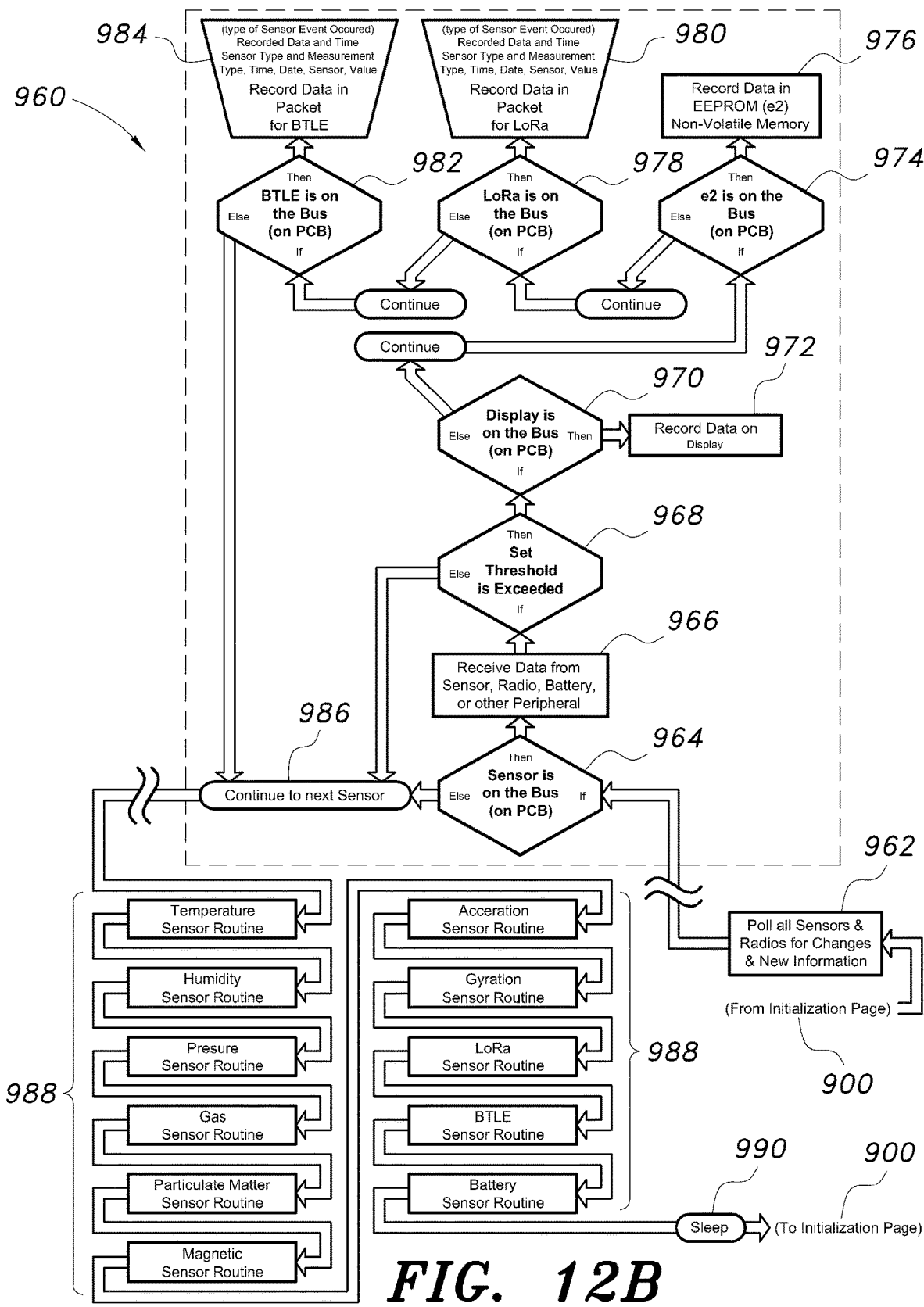

FIG. 12A and FIG. 12B together form a flow chart showing operation of the present invention. FIG. 12A is a flowchart portion 900. FIG. 12B is a flow chart portion 960 showing operation of the present invention.

Flowchart portion 900 is an initialization page of the text flowchart. Steps 902-906 and 912 represent the flow of activity after a power or wake up, prior to going into operation.

Steps 908, 914, 918, 220-228 represent the flow of activity during use of the TIC's SET button. Steps 910, 916, 930-948 represents the flow of activity during use of the TIC's NAV button.

In FIG. 12B, the flow chart portion 960 is an operational page of the TIC's flow chart.

Here, steps 900, 962, 988, and 990 represent the flow of activity after initialization, through operation, and back to sleep. Step 988 represents flow of activity during the polling of all sensors, radios and battery in sequence.

Steps 964-986 represent the flow of activity during specific polling of a single sensor, radio, or battery. Step 964 represents the TIC's ability to see whether or not a sensor circuit is on the device. Step 968 specifically represents the TIC's ability to see if a sensor's threshold has been exceeded.

Step 970 represents the TIC's ability to see whether or not a display is on the device. Step 974 represents the TIC's ability to see whether or not e2 memory is on the device. Step 974 represent the TIC's ability to see whether a LoRa radio is on the device. Step 982 represents the TIC's ability to see whether a BTLE radio is on the device.

The invention being thus described, it will be evident that the same may be varied in many ways by a routineer in the applicable arts. Such variations are not to be regarded as a departure from the spirit and scope of the invention and all such modifications are intended to be included within the scope of the claims.

What is claimed is:

1. An environmental event device for sensing, communicating, and displaying environmental information in association with an asset, to capture changes in a sensor data associated with said asset in real time, and then log it for future examination, comprising:
a nickel sized ultra-thin circuit assembly having a microprocessor, a memory, a display, and a power source, said ultra-thin circuit assembly having a maximum dimension of one inch;
said ultra-thin circuit assembly containing an extremely compact array of both environmental sensors and physical sensors for producing the sensor data associated with said asset; said sensor data being stored in said memory for the future examination;
said ultra-thin circuit assembly containing communication circuitry enabling local and wireless access to said sensor data;
said power source supplying power to said microprocessor, said memory, said display, and said communication circuitry; and
whereby said ultra-thin circuit assembly can capture the changes in said sensor data in the real time associated with said asset, and can then log said sensor data in said memory for the future examination.

2. The environmental event device as claimed in claim 1, further comprising a tri-frequency antenna for transmitting said sensor data.

3. The environmental event device as claimed in claim 1, further comprising a touch ring.

4. The environmental event device as claimed in claim 1, wherein said compact array of both the environmental sensors and the physical sensors includes acceleration sensors for detecting acceleration in three dimensions, and the environmental sensors to enable tracking said asset and to enable monitoring of environmental conditions affecting said asset.

5. An environmental event device for sensing, communicating, and displaying environmental information in association with an asset, to capture sensor data in association with said asset in real time and log it for future examination, comprising:
an ultra-thin circuit assembly having a microprocessor, a memory, a display, and a power source, said ultra-thin circuit assembly having a maximum dimension of one inch;
said ultra-thin circuit assembly containing an extremely compact array of both environmental sensors and physical sensors for producing the sensor data associated with said asset; said sensor data being stored in said memory for the future examination;
said ultra-thin circuit assembly containing communication circuitry enabling local and wireless access to said sensor data;
said power source supplying power to said microprocessor, said memory, said display, and said communication circuitry; and
whereby said ultra-thin circuit assembly can capture changes in said sensor data in the real time associated with said asset, and can then log said sensor data in said memory for the future examination; and whereby said ultra-thing circuit assembly can transmit said sensor data in the real time.

6. The environmental event device as claimed in claim 5, wherein said changes in said sensor data can be transmitted via Bluetooth low energy (BTLE), networked as the asset via a Long Range (LoRa), or locally scrolled at said display.

7. The environmental event device as claimed in claim 5, wherein said changes in said sensor data can be transmitted via Bluetooth low energy (BTLE), networked as the asset via a Long Range (LoRa), or locally scrolled at said display.

8. The environmental event device as claimed in claim 5, wherein recent changes of said changes will remain in said display.

9. The environmental event device as claimed in claim 5, wherein said changes in said sensor data can be transmitted via Bluetooth low energy (BTLE), networked as the asset via a Long Range (LoRa), or locally scrolled at said display.

10. The environmental event device as claimed in claim 5, wherein said ultra-thin circuit assembly, when attached to or carried with said asset, enables tracking any variations in surrounding conditions of a travel of the asset, storage and use, allowing users to know when a surrounding environment of said asset was last affected, and how said asset has been affected over time.

\* \* \* \* \*